US008909364B2

(12) United States Patent
Tsukinoki et al.

(10) Patent No.: US 8,909,364 B2
(45) Date of Patent: Dec. 9, 2014

(54) SUBSTRATE PROCESSING SYSTEM AND SUBSTRATE PROCESSING METHOD

(75) Inventors: Wataru Tsukinoki, Kumamoto (JP); Yuichi Yamamoto, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 595 days.

(21) Appl. No.: 13/114,103

(22) Filed: May 24, 2011

(65) Prior Publication Data

US 2011/0292356 A1    Dec. 1, 2011

(30) Foreign Application Priority Data

Jun. 1, 2010  (JP) ................. 2010-126034

(51) Int. Cl.
*H01L 21/67*   (2006.01)
*H01L 21/677*   (2006.01)

(52) U.S. Cl.
CPC .... *H01L 21/67276* (2013.01); *H01L 21/67745* (2013.01); *H01L 21/67778* (2013.01)
USPC ........... 700/112; 700/101; 700/228; 700/113; 700/121; 700/116

(58) Field of Classification Search
None
See application file for complete search history.

(56) References Cited

U.S. PATENT DOCUMENTS

| | | | | |
|---|---|---|---|---|
| 5,442,561 | A | * | 8/1995 | Yoshizawa et al. ........... 700/100 |
| 5,980,591 | A | * | 11/1999 | Akimoto et al. ............. 29/25.01 |
| 5,993,081 | A | * | 11/1999 | Itoh et al. ....................... 396/611 |
| 6,074,443 | A | * | 6/2000 | Venkatesh et al. ........... 29/25.01 |
| 6,290,405 | B1 | * | 9/2001 | Ueda ............................. 396/611 |
| 6,299,363 | B1 | * | 10/2001 | Ueda ............................. 396/611 |
| 6,360,132 | B2 | * | 3/2002 | Lin et al. ......................... 700/97 |
| 6,449,520 | B1 | * | 9/2002 | Lin et al. ......................... 700/97 |
| 6,496,746 | B2 | * | 12/2002 | Jevtic ............................. 700/100 |
| 6,580,955 | B2 | * | 6/2003 | Lin et al. ......................... 700/97 |
| 6,593,045 | B2 | * | 7/2003 | Sato et al. ....................... 430/30 |
| 6,604,624 | B2 | * | 8/2003 | Hirata et al. .................. 198/494 |
| 6,711,454 | B2 | * | 3/2004 | Joma et al. ................... 700/121 |
| 6,758,647 | B2 | * | 7/2004 | Kaji et al. ..................... 414/217 |
| 7,052,919 | B2 | * | 5/2006 | Oh .................................... 438/5 |
| 7,062,344 | B2 | * | 6/2006 | Yokoyama et al. ........... 700/112 |
| 7,128,481 | B2 | * | 10/2006 | Hashinoki ..................... 396/611 |
| 7,221,993 | B2 | * | 5/2007 | Rice et al. ..................... 700/112 |
| 7,379,785 | B2 | * | 5/2008 | Higashi et al. ................ 700/112 |
| 7,383,093 | B2 | * | 6/2008 | Higashi et al. ................ 700/100 |
| 7,392,106 | B2 | * | 6/2008 | Yokoyama et al. ........... 700/108 |
| 7,603,194 | B2 | * | 10/2009 | Yokoyama et al. ........... 700/108 |
| 7,651,306 | B2 | * | 1/2010 | Rice et al. ..................... 414/217 |
| 7,699,021 | B2 | * | 4/2010 | Volfovski et al. ............. 118/500 |

(Continued)

FOREIGN PATENT DOCUMENTS

JP    2007-335626 A    12/2007

*Primary Examiner* — Kavita Padmanabhan
*Assistant Examiner* — Christopher E Everett
(74) *Attorney, Agent, or Firm* — Abelman, Frayne & Schwab

(57) ABSTRACT

Provided is a substrate processing system including a group controller which determines a combination of processing apparatuses having the shortest total processing time including the processing end time in a final processing apparatus, determines a predictable elapsed time up to a processing start time by a predetermined downstream processing apparatus for a wafer lot from a processing end time of the wafer lot by a predetermined processing apparatus in the combination of the processing apparatuses, and determines a timing of discharging the substrate to the predetermined processing apparatus or an upstream processing apparatus of the predetermined processing apparatus so that the predictable elapsed time is set within a predetermined time when the predictable elapsed time exceeds the predetermined time.

12 Claims, 15 Drawing Sheets

(56) References Cited

U.S. PATENT DOCUMENTS

| | | | |
|---|---|---|---|
| 8,019,467 B2* | 9/2011 | Hongkham et al. | 700/228 |
| 8,146,530 B2* | 4/2012 | Ishikawa et al. | 118/503 |
| 8,181,596 B2* | 5/2012 | Ishikawa et al. | 118/500 |
| 8,550,031 B2* | 10/2013 | Ishikawa et al. | 118/500 |
| 2002/0044860 A1* | 4/2002 | Hayashi et al. | 414/416.03 |
| 2002/0182040 A1* | 12/2002 | Kimura et al. | 414/331.04 |
| 2003/0216053 A1* | 11/2003 | Miyata | 438/758 |
| 2006/0182535 A1* | 8/2006 | Rice et al. | 414/217 |
| 2006/0286300 A1* | 12/2006 | Ishikawa et al. | 427/331 |
| 2007/0059861 A1* | 3/2007 | Rice et al. | 438/107 |
| 2007/0144439 A1* | 6/2007 | Englhardt et al. | 118/719 |
| 2007/0147976 A1* | 6/2007 | Rice et al. | 414/217 |
| 2007/0250202 A1* | 10/2007 | Kaneko et al. | 700/121 |
| 2007/0276530 A1* | 11/2007 | Duffin et al. | 700/112 |
| 2007/0276531 A1* | 11/2007 | Teferra et al. | 700/112 |
| 2008/0019809 A1* | 1/2008 | Takano | 414/222.01 |
| 2008/0086229 A1* | 4/2008 | Ueda et al. | 700/121 |
| 2008/0199282 A1* | 8/2008 | Ishikawa et al. | 414/217 |
| 2008/0232933 A1* | 9/2008 | Kiley | 414/217 |
| 2008/0249648 A1* | 10/2008 | Araki | 700/112 |
| 2010/0131093 A1* | 5/2010 | Yokoyama et al. | 700/112 |
| 2010/0280654 A1* | 11/2010 | Rice et al. | 700/228 |
| 2011/0112675 A1* | 5/2011 | Burda et al. | 700/101 |

* cited by examiner

SUBSTRATE PROCESSING SYSTEM AND SUBSTRATE PROCESSING METHOD

CROSS-REFERENCE TO RELATED APPLICATIONS

This application is based on and claims priority from Japanese Patent Application No. 2010-126034, filed on Jun. 1, 2010, with the Japanese Patent Office, the disclosure of which is incorporated herein in its entirety by reference.

TECHNICAL FIELD

The present disclosure relates to a substrate processing system for performing processes including a photolithography process with respect to a substrate and a substrate transporting method.

BACKGROUND

In a manufacturing process of a semiconductor device, a photolithography process is performed in order to form a pattern on a semiconductor wafer (a "wafer"). Various processes are performed in the photolithography process such as, e.g., a resist coating process for the wafer, an exposure process of exposing the wafer by using an exposure mask after the resist coating process, and a developing process of developing the wafer after the exposure process.

The photolithography process in the semiconductor manufacturing process is performed in a resist pattern forming system connected to an automatic transportation system of a carrier in a factory. One or more wafer lots each including a plurality of sheets of wafers of the same type are stored in the carrier. The resist pattern forming system is configured by connecting a coating/developing apparatus with an exposure apparatus in series. Wafer W that is carried out from the carrier is sequentially delivered to the coating/developing apparatus, the exposure apparatus, and the coating/developing apparatus to be processed and a series of photolithography processes are performed with respect to wafer W.

However, in the resist pattern forming system, when a system of a transportation destination of the carrier is determined, the coating apparatus, the developing apparatus, and the exposure apparatus that are to be used are automatically determined. Accordingly, when any one of the coating, developing, and exposure apparatuses is defective or the processing of wafer W is delayed, other apparatuses are influenced accordingly, thereby deteriorating the processing efficiency of the entire resist pattern forming system. In particular, since a relatively high cost is required to operate the exposure apparatus, an unnecessary cost increases when the processing efficiency is deteriorated as such, and as a result, it is inadvisable.

Japanese Patent Application No. 2007-335626, discloses a substrate processing system in which each of a coating apparatus, a developing apparatus and an exposure apparatus is constructed independently so that the carrier is sequentially transported between the respective processing apparatuses by an automatic transportation system. However, in the photolithography process, if a subsequent processing is not performed within a predetermined time after a processing operation is completed, the quality of the product may deteriorate or the subsequent processing may not be performed normally. In that case, a reproduction processing of the wafer called a rework is required and causes an additional cost.

However, in the substrate processing system, when a wafer (e.g., wafer W1) is carried into the exposure apparatus through a carrier 1 after the resist coating in the coating apparatus, an exposing process for wafer W1 may not be performed within a predetermined time after the resist is applied to wafer W1 because, e.g., another wafer (e.g., wafer W2) of a carrier 2 previously transported to the exposure apparatus may be processed in the exposure apparatus, maintenance of wafer W2 may be performed, or the apparatus may be accidentally defective. However, Japanese Patent Application Laid-Open No. 2007-335626 does not address such problems.

SUMMARY

An exemplary embodiment of the present disclosure provides a substrate processing system performing a processing operation by taking out a substrate from a carrier storing the substrate on each wafer lot, the system includes: (1) a processing apparatus group including a plurality of coating apparatuses each configured to form a resist film on the substrate, a plurality of exposure apparatuses each configured to expose the resist film on the substrate, and a plurality of developing apparatuses each configured to develop the substrate with a developer after an exposure process, (2) the coating apparatuses, exposure apparatuses, and developing apparatuses each including a carry-in and carry-out stage through which a carrier is carried in and out, a carrier standby unit configured to allow the carrier to stand by, a carrier moving and loading unit configured to move and load the carrier between the carry-in and carry-out stage and the carrier standby unit, a delivery mechanism configured to deliver the substrate to the carrier loaded on the carry-in and carry-out stage, and a processing unit configured to perform a target process for the substrate delivered by the delivery mechanism, (3) a common carry-in port with respect to the processing apparatus group configured to receive the carrier from an automatic transportation apparatus and a common carry-out port with respect to the processing apparatus group configured to deliver the carrier to the automatic transportation apparatus, (4) an exclusive transportation mechanism configured to transport the carrier between the processing apparatuses adjacent to each other, (5) a group controller configured to manage the processing apparatus group, and control the carrier moving and loading unit and the exclusive transportation mechanism, and (6) a host computer configured to transmit a processing recipe for the substrate in the carrier transported by the automatic transportation apparatus to the group controller. In particular, the group controller (7-1) determines a combination of processing apparatuses having the shortest total processing time including the processing end time in a final processing apparatus on the basis of the processing recipe of the substrate and a processing status in each processing apparatus when the substrate in the carrier carried into the carry-in port is processed sequentially by the plurality of processing apparatuses, (7-2) calculates a predictable elapsed time up to a processing start time by a predetermined downstream processing apparatus for a wafer lot from a processing end time of the wafer lot by a predetermined processing apparatus in the determined combination of the processing apparatuses on the basis of the processing recipe of the substrate and the processing status in each processing apparatus, and determines a timing of discharging the substrate to the predetermined processing apparatus or an upstream processing apparatus located upperward than the predetermined processing apparatus so that the predictable elapsed time is set within a predetermined time when the predictable elapsed time exceeds the predetermined time, and (7-3) carries out the carrier that stores the substrate in which a series of processing operations is completed by the plurality of processing apparatuses to the carry-out port.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
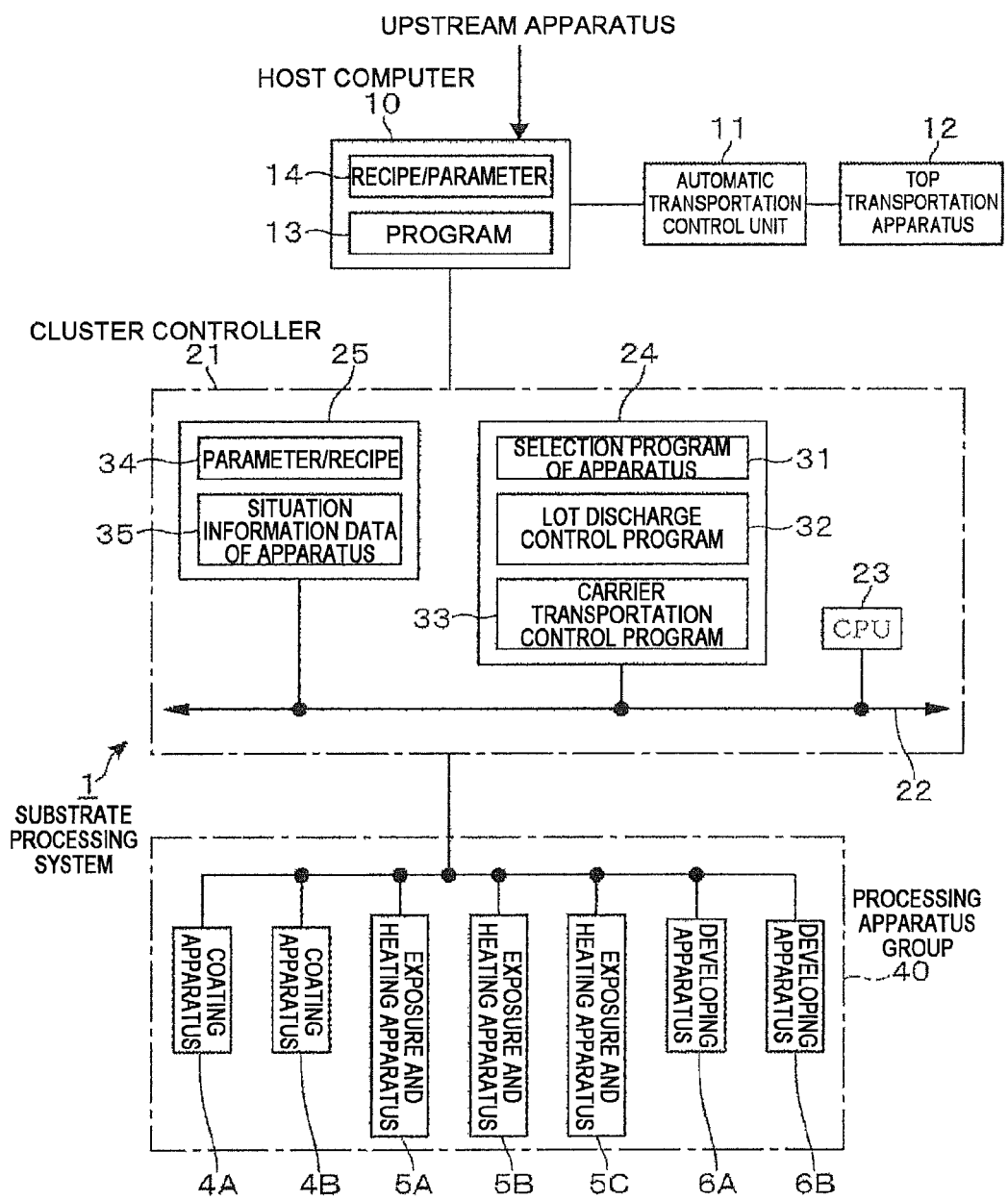
FIG. 1 is an overall configuration diagram of a substrate processing system according to an exemplary embodiment of the present disclosure.

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

The present disclosure has been made in an effort to solve the problems described above and intended to provide a substrate processing system and a substrate processing method that can increase a throughput and prevent unnecessary processing from being performed on a substrate in a photolithography process.

According to an embodiment of the present disclosure, there is provided a substrate processing system performing a processing operation by taking out a substrate from a carrier receiving storing the substrate for each wafer lot, the system includes: (1) a processing apparatus group including a plurality of coating apparatuses each configured to form a resist film on the substrate, a plurality of exposure apparatuses each configured to expose the resist film on the substrate, and a plurality of developing apparatuses each configured to develop the substrate with a developer after an exposure process, (2) the coating apparatuses, exposure apparatuses, and developing apparatuses each including a carry-in and carry-out stage through which a carrier is carried in and out, a carrier standby unit configured to allow the carrier to stand by, a carrier moving and loading unit configured to move and load the carrier between the carry-in and carry-out stage and the carrier standby unit, a delivery mechanism configured to deliver the substrate to the carrier loaded on the carry-in and carry-out stage, and a processing unit configured to perform a target process for the substrate delivered by the delivery mechanism, (3) a common carry-in port with respect to the processing apparatus group configured to receive the carrier from an automatic transportation apparatus and a common carry-out port with respect to the processing apparatus group configured to deliver the carrier to the automatic transportation apparatus, (4) an exclusive transportation mechanism configured to transport the carrier between the processing apparatuses adjacent to each other, (5) a group controller configured to manage the processing apparatus group, and control the carrier moving and loading unit and the exclusive transportation mechanism, and (6) a host computer configured to transmit a processing recipe for the substrate in the carrier transported by the automatic transportation apparatus to the group controller. In particular, the group controller (7-1) determines a combination of processing apparatuses having the shortest total processing time including the processing end time in a final processing apparatus on the basis of the processing recipe of the substrate and a processing status in each processing apparatus when the substrate in the carrier carried into the carry-in port is processed sequentially by the plurality of processing apparatuses, (7-2) calculates a predictable elapsed time up to a processing start time by a predetermined downstream processing apparatus for a wafer lot from a processing end time of the wafer lot by a predetermined processing apparatus in the determined combination of the processing apparatuses on the basis of the processing recipe of the substrate and the processing status in each processing apparatus, and determines a timing of discharging the substrate to the predetermined processing apparatus or an upstream processing apparatus located upperward than the predetermined processing apparatus so that the predictable elapsed time is set within a predetermined time when the predictable elapsed time exceeds the predetermined time, and (7-3) carries out the carrier that stores the substrate in which a series of processing operations is completed by the plurality of processing apparatuses to the carry-out port.

According to another exemplary embodiment of the present disclosure, there is provided a substrate processing system performing a processing operation by taking out a substrate from a carrier receiving a substrate for each wafer lot, the system includes: (1) a processing apparatus group including a plurality of coating apparatuses each configured to form a resist film on the substrate, a plurality of exposure apparatuses each configured to expose the resist film on the substrate, and a plurality of developing apparatuses each configured to develop the substrate with a developer after an exposure process, (2) the coating apparatuses, exposure apparatuses, and developing apparatuses each including a carry-in and carry-out stage through which a carrier is carried in and out, a carrier standby unit configured to allow the carrier to stand by, a carrier moving and loading unit configured to move and load the carrier between the carry-in and carry-out stage and the carrier standby unit, a delivery mechanism configured to deliver the substrate to the carrier loaded on the carry-in and carry-out stage, and a processing unit configured to perform a target process for the substrate delivered by the delivery mechanism, (3) a group controller configured to manage the processing apparatus group, and control the carrier moving and loading unit, and (4) a host computer configured to transmit a processing recipe for the substrate in the carrier transported by the automatic transportation apparatus to the group controller. In particular, the group controller (5-1) determines a combination of processing apparatuses having the shortest total processing time including the processing end time in a final processing apparatus on the basis of a processing recipe of the substrate and a processing status in each processing apparatus when the substrate in the carrier transported by the automatic transportation apparatus is processed sequentially by the plurality of processing apparatuses, (5-2) carries the carrier into the carrier standby unit of a first processing apparatus by the automatic transportation apparatus in the determined combination of the processing apparatuses, (5-3) transports the carrier from the carrier standby unit of an upstream processing apparatus to the carrier standby unit of a downstream processing apparatus sequentially by the automatic transportation apparatus, (5-4) calculates a predictable elapsed time up to a processing start time by a predetermined downstream processing apparatus for a wafer lot from a processing end time of the wafer lot by a predetermined processing apparatus in the determined combination of the processing apparatuses on the basis of the processing recipe of the substrate and the processing status in each processing apparatus, and when the predictable elapsed time exceeds a predetermined time, and determines a timing of discharging the substrate to the predetermined processing apparatus or an upstream processing apparatus located upperward than the processing apparatus so that the predictable elapsed time is set within the predetermined time, and (5-5) carries out the carrier that receives the substrate in which a series processing operations is completed by the automatic transportation apparatus from the carrier standby unit of the processing apparatus that performs a final processing.

Some of the aspects of the substrate processing system according to the exemplary embodiments of the present disclosure are as follows: (a) The combination of the processing apparatuses and the predictable elapsed time may be additionally determined based on maintenance information in each processing apparatus, (b) The processing apparatus group may include a plurality of inspection apparatuses inspecting the substrate developed by the developing apparatus. Each of the inspection apparatuses may include carry-in and carry-out stage through which a carrier is carried in and out, a carrier standby unit configured to allow the carrier to stand by, a carrier moving and loading unit configured to move and load the carrier between the carry-in and carry-out stage and the carrier standby unit, a delivery mechanism configured to deliver the substrate to the carrier loaded on the carry-in and carry-out stage, and an inspection unit configured to inspect the substrate delivered by the delivery mechanism, and (c) The processing apparatus group may include a plurality of cleaning apparatuses cleaning the substrate developed by the developing apparatus. Each of the cleaning apparatuses may include carry-in and carry-out stage through which a carrier is carried in and out, a carrier standby unit configured to allow the carrier to stand by, a carrier moving and loading unit configured to move and load the carrier between the carry-in and carry-out stage and the carrier standby unit, a delivery mechanism configured to deliver the substrate to the carrier loaded on the carry-in and carry-out stage, and a cleaning unit configured to clean the substrate delivered by the delivery mechanism.

According to yet another exemplary embodiment of the present disclosure, there is provided a substrate processing method performed with a substrate processing apparatus including, a processing apparatus group including a plurality of coating apparatuses each configured to form a resist film on the substrate, a plurality of exposure apparatuses each configured to expose the resist film on the substrate, and a plurality of developing apparatuses each configured to develop the substrate with a developer after an exposure process, the coating apparatuses, exposure apparatuses, and developing apparatuses each including a carry-in and carry-out stage through which a carrier is carried in and out, a carrier standby unit configured to allow the carrier to stand by, a carrier moving and loading unit configured to move and load the carrier between the carry-in and carry-out stage and the carrier standby unit, a delivery mechanism configured to deliver the substrate to the carrier loaded on the carry-in and carry-out stage, and a processing unit configured to perform a target process for the substrate delivered by the delivery mechanism. The method includes: carrying the carrier that stores the substrate on each wafer lot into a common carry-in port to the processing apparatus group by an automatic transportation apparatus; transmitting a processing recipe for the substrate in the carrier transported by the automatic transportation apparatus from a host computer to a group controller; determining, by the group controller, a combination of processing apparatuses having the shortest total processing time including the processing end time in a final processing apparatus on the basis of a processing recipe of the substrate and a processing status in each processing apparatus when the substrate in the carrier carried into the carry-in port is processed sequentially by the plurality of processing apparatuses; calculating a predictable elapsed time up to a processing start time by a predetermined downstream processing apparatus for a wafer lot from a processing end time of the wafer lot by a predetermined processing apparatus in the determined combination of the processing apparatuses on the basis of the processing recipe of the substrate and the processing status in each processing apparatus; determining, by the group controller, a timing of discharging the substrate to the predetermined processing apparatus or an upstream processing apparatus of the predetermined processing apparatus so that the predictable elapsed time is set within a predetermined time when the predictable elapsed time exceeds the predetermined time; transporting the carrier that stores the substrate in which processing is completed by the upstream processing apparatus to the downstream processing apparatus through an exclusive transporter configured to transport the carrier between the processing apparatuses adjacent to each other; and carrying out the carrier that stores the substrate in which a series of processing operations is completed by the plurality of processing apparatuses to a common carry-out port of the processing apparatus group.

Yet another exemplary embodiment of the present disclosure provides a substrate processing method performed with a substrate processing apparatus including, a processing apparatus group including a plurality of coating apparatuses each configured to form a resist film on the substrate, a plurality of exposure apparatuses each configured to expose the resist film on the substrate, and a plurality of developing apparatuses configured to develop the substrate with a developer after an exposure process, the coating apparatuses, exposure apparatuses, and developing apparatuses each including a carry-in and carry-out stage through which a carrier is carried in and out, a carrier standby unit configured to allow the carrier to stand by, a carrier moving and loading unit configured to move and load the carrier between the carry-in and carry-out stage and the carrier standby unit, a delivery mechanism configured to deliver the substrate to the carrier loaded on the carry-in and carry-out stage, and a processing unit configured to perform a target process for the substrate delivered by the delivery mechanism. The method includes: transporting the carrier that stores the substrate on each wafer lot by an automatic transportation apparatus; transmitting a processing recipe for the substrate in the carrier transported by the automatic transportation apparatus from a host computer to a group controller; determining, by the group controller, a combination of processing apparatuses having the shortest total processing time including the processing end time in a final processing apparatus on the basis of a processing recipe of the substrate and a processing status in each processing apparatus when the substrate in the carrier is processed sequentially by the plurality of processing apparatuses; delivering the carrier to the carrier standby unit of a processing apparatus positioned at an uppermost stream side in the determined combination of the processing apparatuses by the automatic transportation apparatus; calculating, by the group controller, a predictable elapsed time up to a processing start time by a predetermined downstream processing apparatus for a wafer lot from a processing end time of the wafer lot by a predetermined processing apparatus in the determined combination of the processing apparatuses on the basis of the processing recipe of the substrate and the processing status in each processing apparatus; determining, by the group controller, a timing of discharging the substrate to the predetermined processing apparatus or an upstream processing apparatus of the predetermined processing apparatus so that the predictable elapsed time is set within a predetermined time when the predictable elapsed time exceeds the predetermined time; transporting the carrier from the carrier standby unit of the upstream processing apparatus to the carrier standby unit of the downstream processing apparatus sequentially by the automatic transportation apparatus; and carrying out the carrier that stores the substrate in which a series of processing operations is completed by the automatic transportation apparatus from the carrier standby unit of the processing apparatus that performs a final processing.

Some of the aspects of the substrate processing method discussed above are as follows: (a) The combination of the processing apparatuses and the predictable elapsed time may be additionally determined based on maintenance information in each processing apparatus, (b) The processing apparatus group may include a plurality of inspection apparatuses inspecting the substrate developed by the developing apparatus. Each of the inspection apparatuses may include carry-in and carry-out stage through which a carrier is carried in and out, a carrier standby unit configured to allow the carrier to stand by, a carrier moving and loading unit configured to move and load the carrier between the carry-in and carry-out stage and the carrier standby unit, a delivery mechanism configured to deliver the substrate to the carrier loaded on the carry-in and carry-out stage, and an inspection unit configured to inspect the substrate delivered by the delivery mechanism, and (c) The processing apparatus group may include a plurality of cleaning apparatuses cleaning the substrate developed by the developing apparatus. The cleaning apparatuses may include carry-in and carry-out stage through which a carrier is carried in and out, a carrier standby unit configured to allow the carrier to stand by, a carrier moving and loading unit configured to move and load the carrier between the carry-in and carry-out stage and the carrier standby unit, a delivery mechanism configured to deliver the substrate to the carrier loaded on the carry-in and carry-out stage, and a cleaning unit configured to clean the substrate delivered by the delivery mechanism.

According to the exemplary embodiments of the present disclosure described above, a combination of processing apparatuses used in the processing apparatus group including a plurality of coating apparatuses, a plurality of exposure apparatuses, and a plurality of developing apparatuses is determined such that a total processing time of a wafer lot including the processing end time in a final processing apparatus is to be a shortest time, and in addition, a timing at which a substrate is discharged to a predetermined processing apparatus or an upstream processing apparatus of the predetermined processing apparatus may be determined. Accordingly, a throughput can be improved, and unnecessary processing can be prevented from being performed on the substrate.

First Exemplary Embodiment

FIG. 1 is an overall configuration diagram of a substrate processing system 1 according to an exemplary embodiment of the present disclosure. Substrate processing system 1 includes a processing apparatus group 40, and a carrier C is transported between the processing apparatuses to form a resist pattern on a wafer W. A plurality of sheets of wafers W with the same type, referred to as a wafer lot, are stored in one carrier C. Substrate processing system 1 further includes a host computer 1, a cluster controller 21, a top transportation apparatus 12, and processing apparatus group 40. Processing apparatus group 40 includes coating apparatuses 4A and 4B, exposure and heating apparatuses 5A to 5C, and developing apparatuses 6A and 6B.

Top transportation apparatus 12 is connected to host computer 10 through an automatic transportation control unit 11. Further, cluster controller 21 is connected to host computer 10, and processing apparatus group 40 is connected to a downstream side of cluster controller 21. Coating apparatuses 4A and 4B, exposure and heating apparatuses 5A to 5C, and developing apparatuses 6A and 6B constituting processing apparatus group 40 are connected to each other in parallel when viewed from cluster controller 21. In addition, host computer 10 is connected to an upstream apparatus that processes wafer W at an upstream side of substrate processing system 1. Wafer W is transported to substrate processing system 1 from the upstream apparatus while being stored in carrier C. When processing of the wafer lot is terminated in the upstream apparatus, the upstream apparatus transmits a signal indicating the intent thereof to host computer 10.

Host computer 10 includes a program 13 and a memory 14. In program 13, a step group is set up so as to perform transportation of carrier C or wafer W, and perform each processing of wafer W as described below by controlling the operation of substrate processing system 1. In memory 14, various kinds of recipes are stored set in association with, e.g., a film thickness of a resist film or a line width of a resist pattern formed on wafer W. In each recipe, a parameter for processing wafer W in processing apparatus group 40 is correspondingly stored. The parameter includes, e.g., the supply amount of chemicals supplied from each processing apparatus, a supply time of chemicals, a heating temperature of wafer W, and an illuminance at the time of exposure. A user of substrate processing system 1 may set up the parameter by, e.g., matching a wafer lot and a recipe for processing the wafer lot from an input unit (not shown) which is provided in host computer 10.

Continually, cluster controller (group controller) 21 will be described. In the figure, reference numeral 22 represents a system bus, and a CPU 23 performing various operations, a program storing unit 24, and a main memory 25 are connected to system bus 22. Program storing unit 24 includes a selection program 31 of each processing apparatus, a wafer lot discharge control program 32, and a carrier transportation control program 33. Each program is stored in program storing unit 24 with having been stored in a storage medium, such as, e.g., a hard disk, a compact disk, a magnet optical disk, or a memory card.

Selection program 31 of the processing apparatus determines a transportation destination of carrier C on the basis of a time required to adjust a module in the apparatus to be described below, and on the basis of a maintenance status or a processing status in each processing apparatus. The processing apparatus to which carrier C will be transported is determined among the same type of processing apparatuses that perform the same processing with respect to wafer W, for example, among coating apparatuses 4A and 4B or among exposure and heating apparatuses 5A to 5C.

Lot discharge control program 32 calculates a predictable elapsed time to be described below and controls a start timing of the discharge of wafer W to coating apparatuses 4A and 4B from carrier C transported to coating apparatuses 4A and 4B on the basis of the calculation result. Carrier transportation control program 33 serves to transport carrier C to the processing apparatus selected by selection program 31 of the processing apparatus, and controls the operations of carrier transporting members 81 and 82 to be described below to control the delivery of carrier C between the processing apparatuses and within the processing apparatuses.

A recipe storing unit 34 and a status information data storing unit 35 are formed in main memory 25. Additional information including, e.g., an ID of a wafer lot transmitted from host computer 10, a recipe set in association with the wafer lot, a processing parameter corresponding to the recipe, and the sheet number of wafers W constituting the wafer lot is stored in recipe storing unit 34 to be corresponded to one another.

Status information data is transmitted to cluster controller 21 from each processing apparatus in real time and stored in status information data storing unit 35. The stored status information data may be updated. The status information data includes, e.g., the processing status in each processing apparatus, the maintenance information, and the time required to adjust the module in the apparatus. The processing status includes, e.g., data indicating whether the processing apparatus is operating, an operation restart time when the apparatus does not operate, a time until the processing of a carrier which is being processed at present is terminated, and a processing time of a carrier to be processed from now. The maintenance information includes, e.g., a time when the processing apparatus is maintained and a time from the start of the maintenance to the end of the maintenance.

The time up to the end of the processing of carrier C which is being processed at present represents the sum of a time duration from a present time until a final wafer W of the wafer lot included in carrier C returns to carrier C, and a discharge time of carrier C. The processing time of carrier C represents the sum of the time until a first wafer of the wafer lot is carried in the apparatus and thereafter, the final wafer of the wafer lot returns to carrier C, the discharge time of carrier C, and a preparation time of carrier C. The preparation time and the discharge time of carrier C will be described below.

The time required to adjust the module in the apparatus is the time required to adjust an environment of each module in order to process a subsequent wafer lot after the processing apparatus ends the processing of one wafer lot. The adjustment of the module environment includes, e.g., adjusting the temperature of a heat plate that heats wafer W in the heating module or adjusting exposure illuminance of exposure and heating apparatus 5. The time required for the adjustment is determined by, e.g., each processing apparatus on the basis of a recipe set in the wafer lot processed before and after the adjustment.

Figure 2:
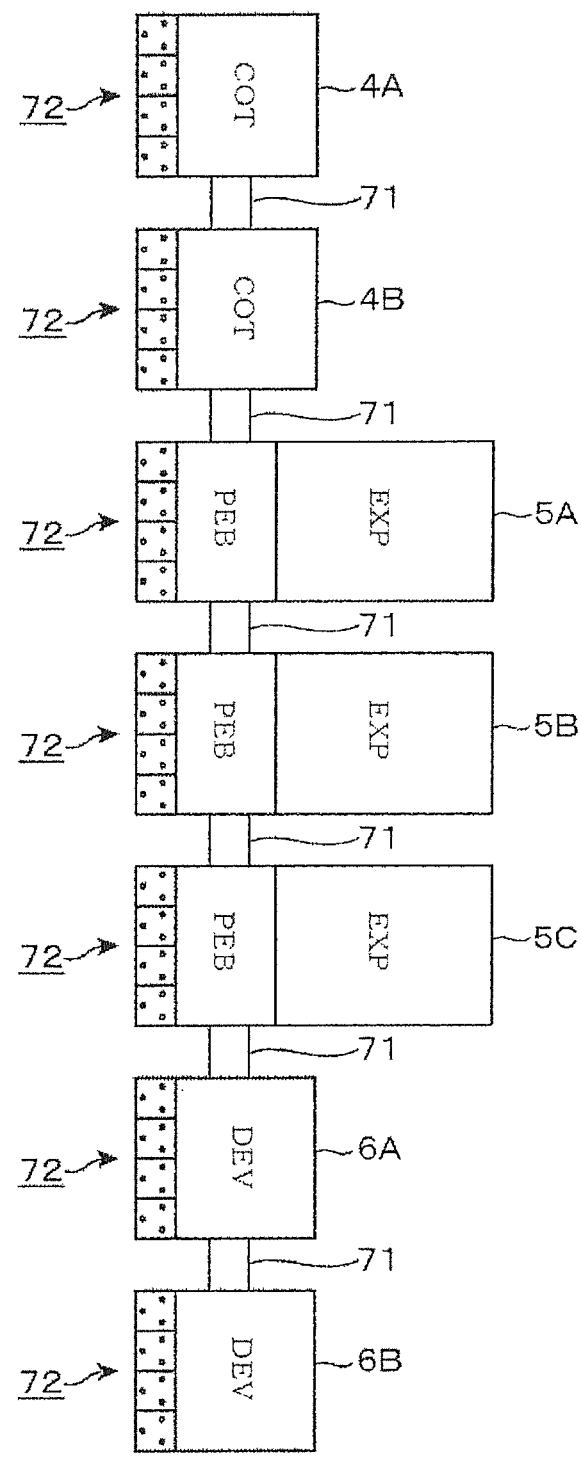
FIG. 2 is a pattern diagram showing connections of a processing apparatuses constituting a substrate processing system.

Continuously, processing apparatus group 40 will be described. FIG. 2 shows a placement layout of coating apparatuses 4A and 4B, exposure and heating apparatuses 5A to 5C, and developing apparatuses 6A and 6B. As shown in the figure, coating apparatuses 4A and 4B, exposure and heating apparatuses 5A to 5C, and developing apparatuses 6A and 6B are arranged in line in the order as described. In addition, the processing apparatuses are connected to one another by an exclusive transportation path 71 of carrier C.

Figure 3:
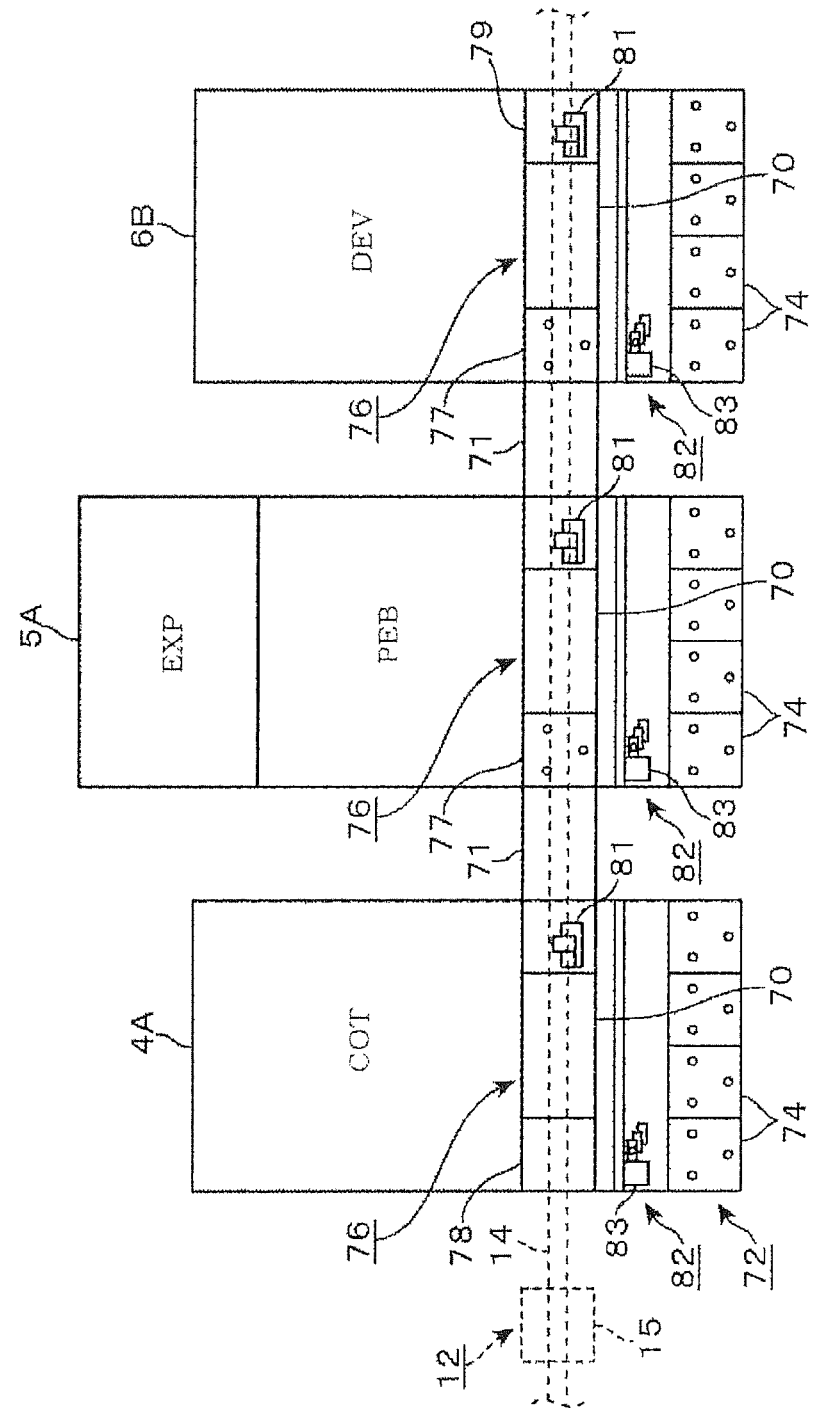
FIG. 3 is a schematic diagram of a processing apparatus group.
Figure 4:
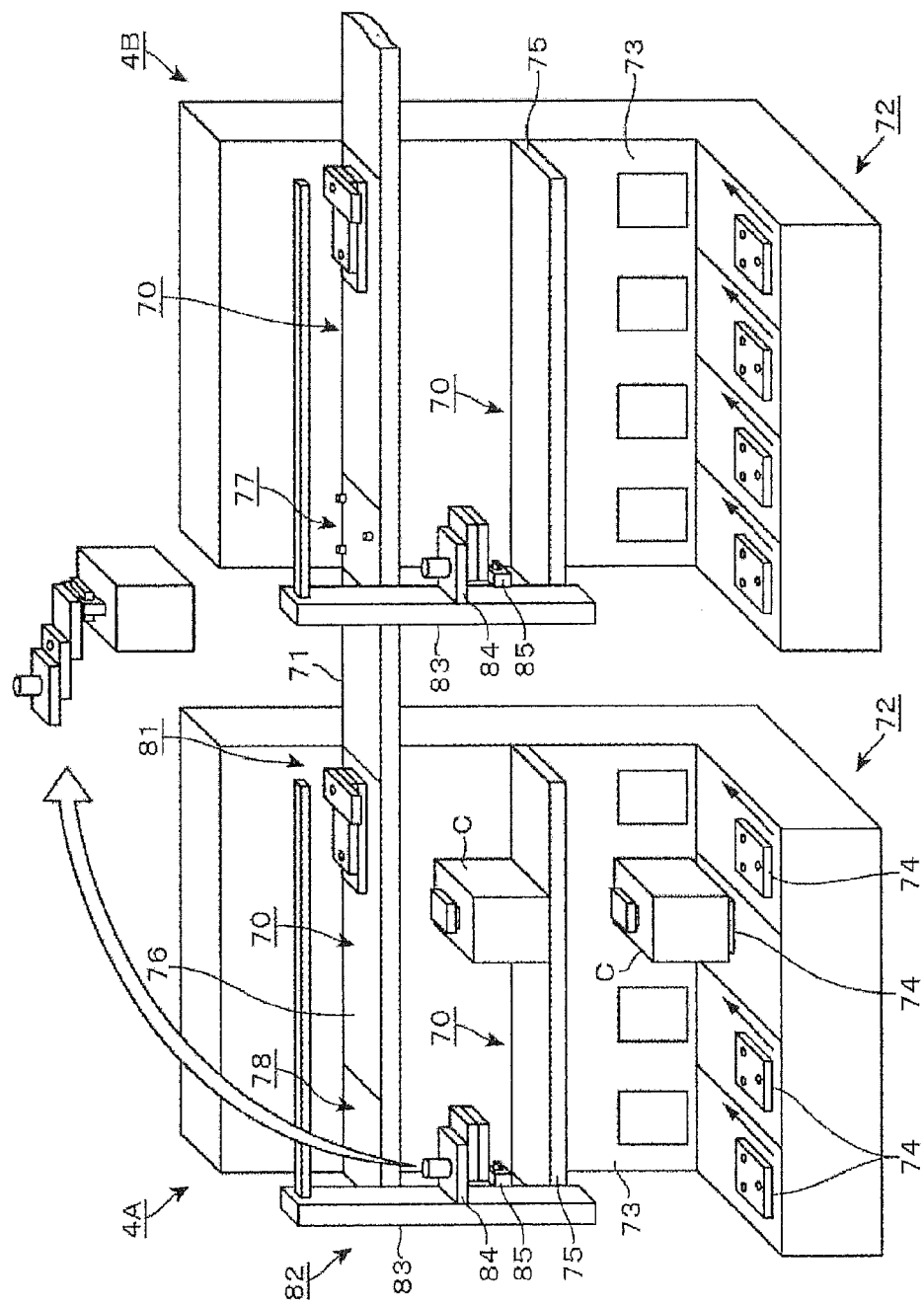
FIG. 4 is a perspective view showing a load port.

In FIG. 3, only coating apparatus 4A, exposure and heating apparatus 5A, and developing apparatus 6B are shown by simplifying a configuration of processing apparatus group 40 of FIG. 2 for brevity. Each processing apparatus includes a carrier station 72 for carrying in carrier C. Carrier station 72 includes load ports 73, and load ports 73 and 73 are connected by exclusive transportation path 71 between adjacent processing apparatuses. FIG. 4 shows the front surfaces of two load ports 73 and 73 connected to each other. A carrier loading plate 74 constituting a carry-in/carry-out stage is provided at load port 73, and carrier loading plate 74 includes a holding mechanism that holds carrier C. Carrier loading plate 74 advances and retreats between a retreated position for delivering carrier C and an advanced position for discharging wafer W from carrier C in carrier station 72.

The preparation time of carrier C represents the time until carrier loading plate 74 receives carrier C at the retreating position and moves to the advancing position to discharge wafer W to the apparatus. During the preparation time, carrier C is held by the holding mechanism of carrier loading plate 74, a cover of carrier C is opened, and a height position of carrier C is adjusted by carrier loading plate 74. The discharge time of carrier C represents the time until all of wafers W return to carrier C and moves to the retreating position, and during that time, the cover of carrier C is closed and the holding of carrier C by the holding mechanism is cancelled.

Platform portions 75 and 76 are provided above carrier loading plate 74 and platform portions 75 and 76 include a retreating region 70 configuring a carrier standby portion that temporarily retreats carrier C which is carried into the processing apparatus. Carrier C transported to the processing apparatus retreats to retreating region 70 until carrier loading plate 74 is empty when carrier loading plate 74 is full. Carrier C is transported from retreating region 70 to carrier loading plate 74 according to the order as transported to the processing apparatus. Further, in the process apparatuses except for coating apparatus 4A, the part of coating apparatus 4A of platform portion 76 is configured as a carry-in port 77 for receiving carrier C from the processing apparatus adjacent to the part of coating apparatus 4A.

In each of process apparatus except for coating apparatus 4A, the part of coating apparatus 4A of platform portion 76 in each processing apparatus is configured as a carry-in port 77 for receiving carrier C from the processing adjacent to the part of coating apparatus 4A. Further, as shown in FIG. 3, a common carry-in port 78 for receiving carrier C from top transportation apparatus 12 is provided in coating apparatus 4A, instead of carry-in port 77.

In each processing apparatus except for developing apparatus 6B, an inter-apparatus carrier transportation member 81 is provided in the part of developing apparatus 6B of platform portion 76 of each processing apparatus constituting a carrier moving loader for delivering carrier C to the processing apparatus adjacent to the part of developing apparatus 6B. In addition, in platform portion 76 of developing apparatus 6B, a common carry-out port 79 for delivering carrier C to top transportation apparatus 12 is provided instead of inter-apparatus carrier transportation member 81 as shown in FIG. 3.

Further, load port 73 includes an in-apparatus carrier transportation member 82. Carrier transportation member 82 includes a base portion 84 which can move up and down along an elevating shaft 83, and a multi joint transportation arm 85 which is connected to base portion 84 and is rotatable around a vertical shaft with respect to base portion 84. Elevating shaft 83 is configured to be movable in a horizontal direction along a guide rail 86. By carrier transportation member 82, carrier C is delivered between retreating regions of 70 of platform portions 75 an 76, inter-apparatuses carrier transportation members 81, and carrier loading plate 74. The end of an arrow in FIG. 4 represents a state in which transportation arm 85 grips carrier C in order to achieve the delivery.

Top transportation apparatus 12 will be described. Top transportation apparatus 12 includes a rail 14 represented by a dot line in FIG. 3 and a transportation apparatus body 15 which moves along with rail 14. Although not shown, transportation apparatus body 15 includes a grip portion gripping carrier C, and transports carrier C to common carry-in port 78 of coating apparatus 4A from upstream apparatus, and carries out carrier C from common carry-out port 79 provided in developing apparatus 6B.

Figure 5:
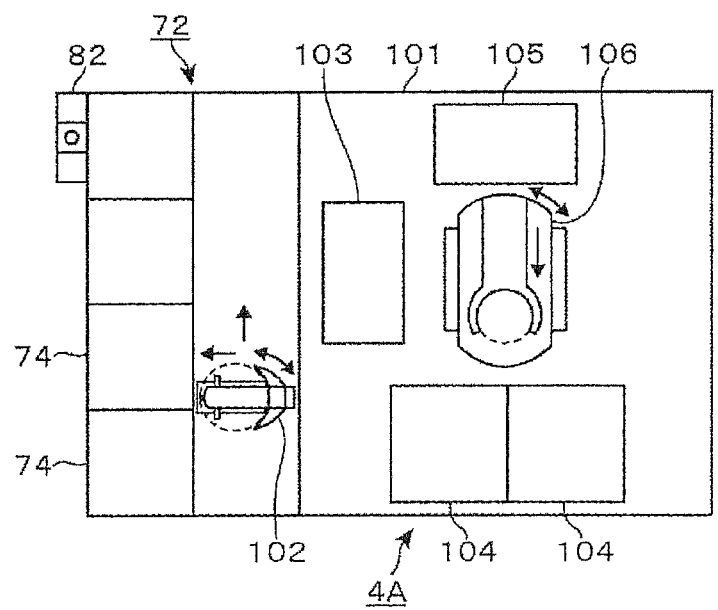
FIG. 5 is a plan view of a coating apparatus constituting the processing apparatus group.

Continually, coating apparatus 4A will be described with reference to FIG. 5. A processing station 101 is connected to a carrier station 72 provided in coating apparatus 4A. A transportation arm 102 provided in carrier station 72 delivers wafer W between carrier C loaded in carrier loading plate 74 and a delivery module 103 provided in processing station 101. In processing station 101, delivery module 103, coating modules 104 stacked on a plurality of stages, and heating modules 105 stacked on the plurality of stages are provided in a peripheral direction. Further, a main transportation arm 106 is provided to be surrounded by the modules. Main transportation arm 106 is configured to be capable of elevating, rotating, advancing and retreating, and delivers wafer W between the modules. Coating module 104 supplies resist to wafer W as chemical liquid to form a resist film. Since coating apparatus 4B is configured in the similar manner to coating apparatus 4A, a detailed description will be omitted.

Developing apparatuses 6A and 6B include a developing module 107 corresponding to coating module 104, and in developing module 107, developer is supplied to wafer W instead of the resist. Further, a heating module 108 corresponding to heating module 105 of coating apparatus 4 is provided. Except for the difference as described above, developing apparatuses 6A and 6B are configured in the similar manner to coating apparatus 4A.

Figure 6:
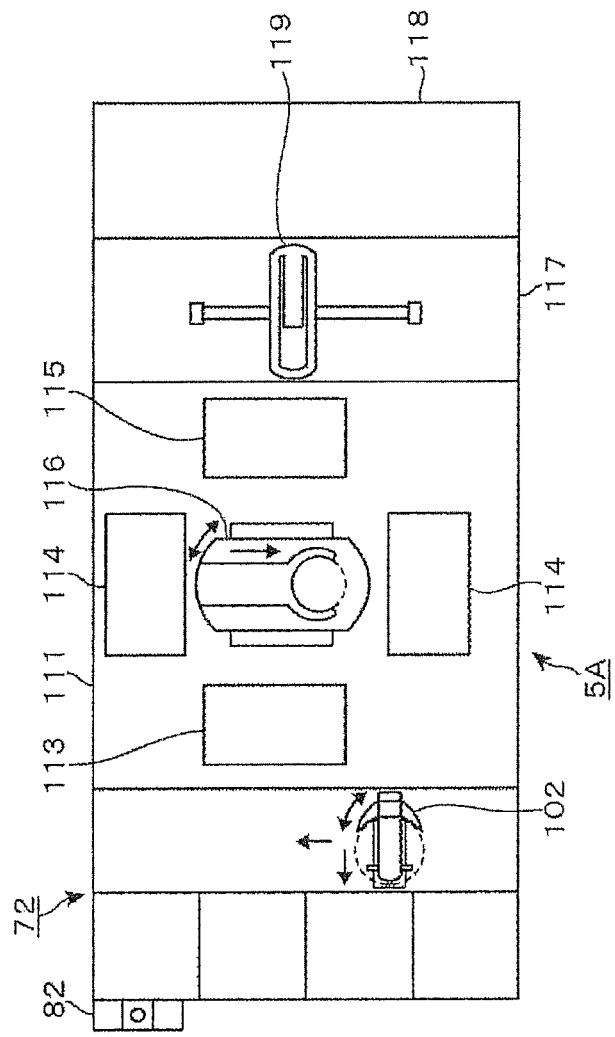
FIG. 6 is a plan view of an exposure apparatus constituting the processing apparatus group.

Exposure and heating apparatus 5A will be described with reference to FIG. 6. A processing station 111 is connected to carrier station 72 included in exposure and heating apparatus 5A, and transportation arm 102 provided in carrier station 72 delivers wafer W between carrier C loaded in carrier loading plate 74 and a delivery module 113 provided in processing station 111. In processing station 111, delivery module 113, heating modules 114 stacked on the plurality of stages, and a delivery module 115 are provided in a peripheral direction, and a main transportation arm 116 is provided to be surrounded by the modules.

Main transportation arm 116 is configured to be capable of elevating, rotating, advancing and retreating, and delivers wafer W between the modules. An exposure apparatus 118 is connected to processing station 111 through an interface block 117. An interface arm 119 delivers wafer W between delivery module 115 and exposure apparatus 118. Exposure and heating apparatuses 5B and 5C are configured in the similar manner to exposure and heating apparatus 5A.

Figure 7:
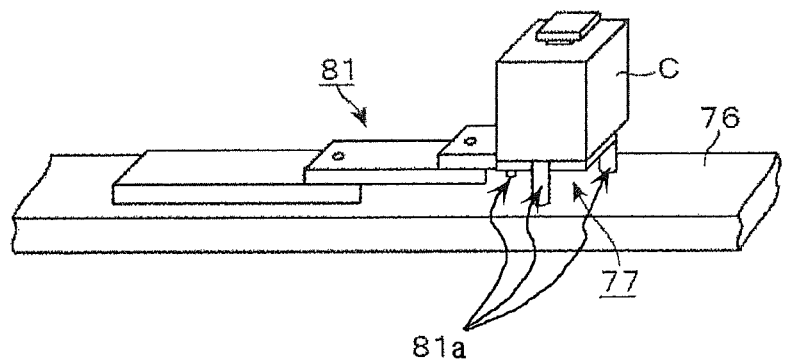
FIG. 7 is a perspective view showing an operation of a carrier transporting mechanism among apparatuses.

The delivery of carrier C among the respective processing apparatuses of processing apparatus group 40 will be described with reference to FIG. 7. Inter-apparatus carrier transportation member 81 is configured as a multi-joint arm and when carrier C is delivered to a fore-end portion of the arm by in-apparatus carrier transportation member 82, the fore-end portion moves toward carry-in port 77 of a processing apparatus adjacent to the part of developing apparatus 6 while maintaining carrier C. Carry-in port 77, for example, includes a support pin 81a which is elevatable and carrier C is delivered to carry-in port 77 by the cooperation between support pin 81a and inter-apparatus carrier transportation member 81.

Power supplies or controllers of carrier transportation members 81 and 82 and carry-in port 77 are separated from a power supply or a controller of a processing apparatus in which the transportation members and the port are provided. As a result, even when the power supply is failed, maintenance is performed, or processing is suddenly stopped in the processing apparatus on a path through which carrier C is transported, carrier C including a wafer lot which is not processed in the processing apparatus is allowed to be transported to a processing apparatus performing a subsequent process.

Figure 8:
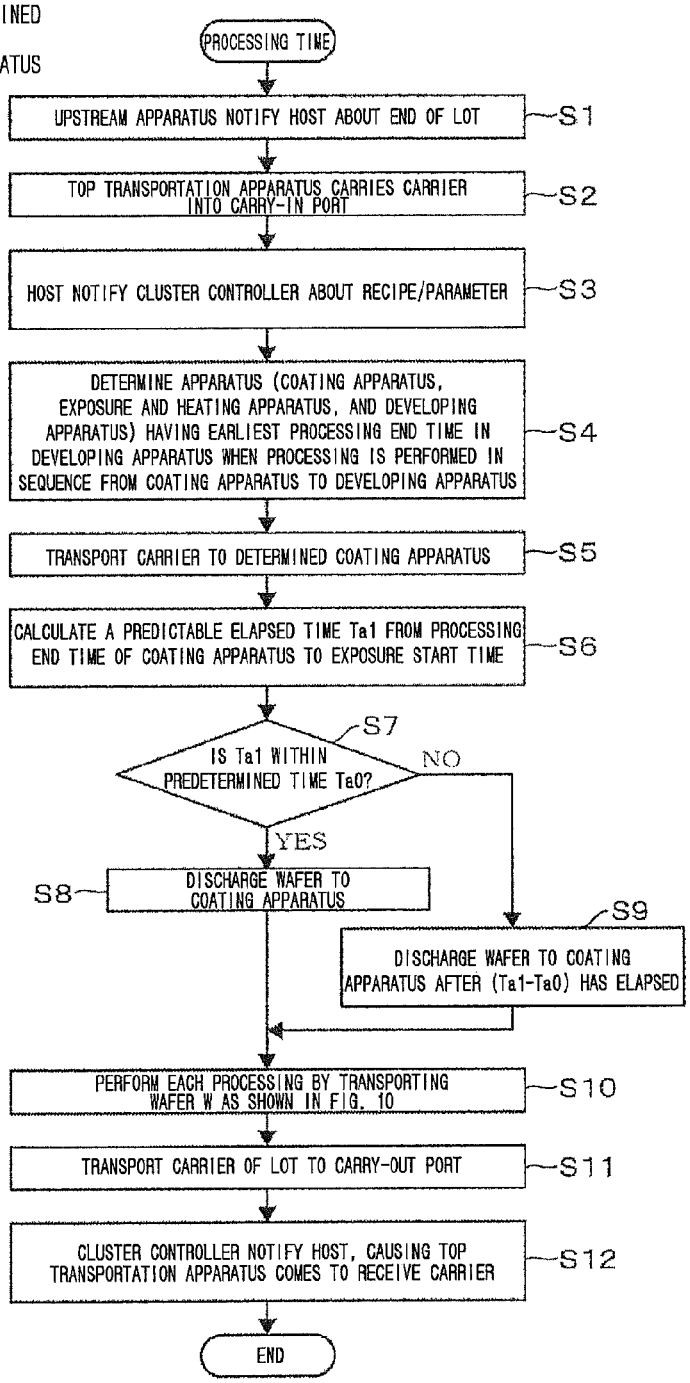
FIG. 8 is a flowchart showing a processing process of a substrate processing system.

Continually, an operation of substrate processing system 1 will be described with reference to a flow of FIG. 8. In this example, an elapsed time from the time when processing of a wafer lot ends in coating apparatus 4 to the time when the processing of the wafer lot begins in the exposure and heating apparatus is controlled. Host computer 10 receives a signal indicating that the processing of the wafer lot of carrier C ends from the upstream apparatus (step S1). Host computer 10 transmits the signal to top transportation apparatus 12 and top transportation apparatus 12 receives carrier C from the upstream apparatus to carry carrier C into common carry-in port 78 (step S2).

Host computer 10 transmits additional information including, e.g., an ID of the wafer lot in carrier C, a recipe, a processing parameter corresponding to the recipe, and the sheet number of wafers W to cluster controller 21, and those information data is stored in main memory 25 of cluster controller 21 (step S3).

In addition, cluster controller 21 selects coating apparatus 4 which can begin the processing of the wafer lot more rapidly. Selection of coating apparatus 4 will be described with reference to a time chart of FIG. 9 as an example. At a time t0 when carrier C is carried into common carry-in port 78, for example, it is assumed that wafer lots A and B have already been carried into coating apparatus 4A, and wafer lots C and D have already been carried into coating apparatus 4B, and a wafer lot newly carried into substrate processing system 1 is represented by a wafer lot E. Further, it is assumed that wafer lots A and B are being processed in coating apparatuses 4A and 4B.

Cluster controller 21 calculates times t1 and t2 where processing of carriers of wafer lots C and D ends, respectively, on the basis of a time until the processing of carriers of wafer lots A and B, a time required to adjust the module during the gap among the respective wafer lot processing operations, and processing times of carriers of wafer lots C and D. Continuously, cluster controller 21 transmits data such as the sheet number and the recipe of wafer W to coating apparatuses 4A and 4B, processing parameters with respect to wafer lot E. Coating apparatuses 4A and 4B calculate the processing time of the carrier of wafer lot E and the time required to adjust the module on the basis of the transmitted data. Cluster controller 21 receives the calculated information and calculates processing end times t3 and t4 of the carrier of wafer lot E in case it is assumed that wafer lot E is processed by each of coating apparatuses 4A and 4B. Herein, it is assumed that a start time of the adjustment is the time t1 and t2 when the processing of the carriers of wafer lots C and D ends.

Continuously, cluster controller 21 determines whether a time interval between times t1 and t3 and a time interval between times t2 and t4 are overlapped with the maintenance execution time in each apparatus. When not overlapped, times t5 and t6 are set as a processing start time of wafer lot E when the adjustment ends after the times t1 and t2. When the time interval between the times t1 and t3 and the time interval between the times t2 and t4 are overlapped with the maintenance execution time, e.g., the adjustment is performed at the time when the maintenance ends and calculate the processing start times t5 and t6 of carrier C of wafer lot E again. In an example of FIG. 9, the time interval between times t1 and t3 is overlapped with the maintenance execution time in coating apparatus 4A. Therefore, as indicated with an arrow in the figure, after the maintenance ends, processing start time t5 is calculated by setting the adjustment time and the processing time of carrier C of wafer lot E to different times so that the adjustment and the processing of carrier C of wafer lot E are sequentially performed.

In addition, cluster controller 21 determines which of processing start time t5 of carrier C of wafer lot E in coating apparatus 4A or processing start time t6 of carrier C of wafer lot E in coating apparatus 4B is earlier, and determines carrier C including wafer lot E to be transported to coating apparatus 4 having the earlier processing start time.

As described above, cluster controller 21 detects a time when the adjustment can be performed in order to process wafer lot E in each of coating apparatuses 4A and 4B on the basis of a processing status of a wafer lot which is determined to be processed earlier by each of coating apparatuses 4A or 4B. In addition, in each coating apparatus, it is determined whether the adjustment time of wafer lot E and the processing time of wafer lot E are overlapped with the maintenance time. When overlapped, the adjustment execution time is set to different times at the maintenance end time and a time when wafer lot E can be processed in each apparatus 4A or 4B is detected, and a transportation destination of wafer lot E is determined on the basis of the detected times.

Although the determination method of coating apparatus 4 has been described above, cluster controller 21 determines the processing start time of carrier C of wafer lot E on the basis of the processing status, the maintenance information, and the adjustment time in each processing apparatus with respect to exposure and heating apparatus 5 and developing apparatus 6 similarly to coating apparatus 4. In addition, cluster controller 21 determines transportation of carrier C of wafer lot E to the apparatus having the earliest processing start time among exposure and heating apparatuses 5A to 5C. Further, cluster controller 21 determines transportation of the carrier of wafer lot E to the apparatus having the earliest processing start time of developing apparatuses 6A to 6B (step S4). That is, cluster controller 21 selects the processing apparatus to end the processing of wafer lot E earliest.

Cluster controller 21 commands that the processing is performed with a processing parameter of wafer lot E transmitted to each processing apparatus selected in step S4. In addition,
carrier C is transported to carrier loading plate 74 or retreating region 70 of coating apparatus 4 (coating apparatus 4B in the case of FIG. 9) selected through carrier transportation members 81 and 82 from common carry-in port 77 (step S5). When carrier C is transported to retreating region 70, carrier C is transported to loading plate 74 as soon as carrier loading unit 74 becomes empty.

Figure 9:
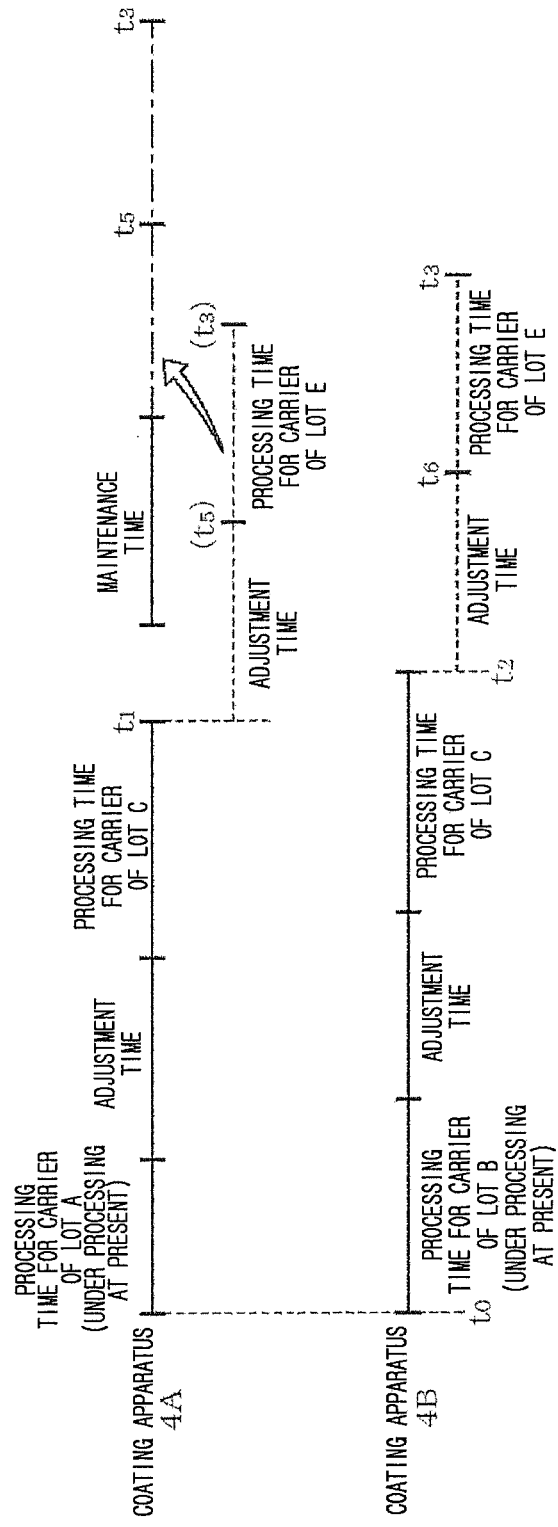
FIG. 9 is a time chart showing a processing status and a maintenance time of a wafer lot.

Continually, cluster controller 21 calculates the difference between the processing end time (e.g., the time t4 is the processing end time of wafer lot E in the example of FIG. 9) of the carrier of wafer lot E in selected coating apparatus 4 and the processing start time of wafer lot E of selected exposure and heating apparatus 5 to calculate a predictable elapsed time Ta1 from the end of the coating processing to the start of the exposure processing (step S6).

Continually, cluster controller 21 determines whether predictable elapsed time Ta1 is within a predetermined time Ta0 (step S7). When it is determined that predictable elapsed time Ta1 is within predetermined time Ta0 in step S7, processing of a carrier of a wafer lot (wafer lot D in FIG. 9) just before wafer lot E and the adjustment of the module for processing wafer lot E sequentially end in selected coating apparatus 4, and thereafter, at the time when the carrier of wafer lot E can be processed, the processing of the carrier begins (step S8). When it is determined that predictable standby time Ta is not within predetermined time T0 in step S7, the processing of wafer lot E begins after the time equals to "Ta1−Ta0" has elapsed from the time when wafer lot E can be processed (step S9).

Figure 10:
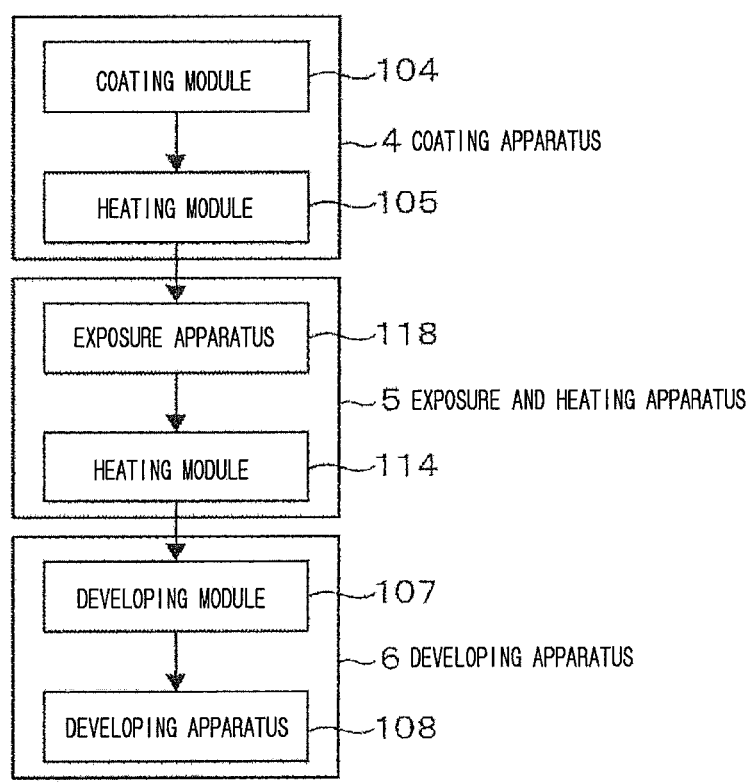
FIG. 10 is a pattern diagram showing a transportation path of a wafer.

Thereafter, a transportation path of wafer W will be described with reference to FIG. 10. Wafer W discharged from carrier C is transported sequentially to delivery module 103 and coating module 104 in coating apparatus 4, and as a result, resist is applied to wafer W in coating module 104. Continually, wafer W is heated in heating module 105 and then, transported sequentially to delivery module 103 and carrier C.

When the processing for all of wafers W in carrier C is completed in coating apparatus 4, carrier C is transported to carrier loading plate 74 of selected exposure and heating apparatus 5 by transportation members 81 and 82. When wafer W can be processed in exposure and heating apparatus 5, wafers W are sequentially discharged from carrier C. Wafers W are transported sequentially to delivery module 113, delivery module 115, and exposure apparatus 118 to be subjected to an exposure processing in the order as described. Exposure-processed wafers W are transported sequentially to delivery module 115 and heating module 114 and then, subjected to a heating processing (e.g., a post exposure bake) in heating module 114. Heating-processed wafers W are returned to carrier C via delivery module 113.

Continually, carrier C is transported to selected developing apparatus 6. In addition, wafers W discharged from carrier C are transported sequentially to delivery module 103 and developing module 107 of developing apparatus 6 in the order as described to be subjected to a developing processing. Continually, wafer W is subjected to heating processing (e.g. a post bake) in heating module 108 and then, transported sequentially to delivery module 103 and carrier C in the order as described (step S10).

After wafers W of all wafer lots E are transported to carrier C, carrier C is transported to common carry-out port 79 (step S11), and cluster controller 21 outputs a signal to host computer 10 indicating an intent of capable of preparing for carrying out carrier C. Host computer 10 transmits the signal to top transportation apparatus 12, and top transportation apparatus 12 receives carrier C through common carry-out port 79 and transports carrier C to a downstream apparatus (step S12).

According to substrate processing system 1, cluster controller 21 selects an apparatus having the earliest start time of processing for a wafer lot among processing apparatuses of the same type on the basis of a processing status and a maintenance status of the wafer lots of the processing apparatuses. Therefore, e.g., as compared with the substrate processing system in which the exposure apparatus is connected to the coating and developing apparatuses, since the transportation destination of the wafer lot can be selected depending on the status of the processing apparatus as described above, the wafer lot can be efficiently processed in each processing apparatus, thereby improving a throughput. Further, a predictable elapsed time Ta1 is calculated from the processing end time in selected coating apparatus 4 to the exposure processing start time, and the discharge of wafer W is controlled based on the predictable elapsed time. Accordingly, since the time up to the exposure from the coating of resist to wafer W is suppressed from being extended, wafer W can be prevented from being unnecessarily processed, thereby reducing a cost.

In substrate processing system 1, top transportation apparatus 12 accesses one carrier C only twice at the time of carrying carrier C into common carry-in port 78 and at the time of carrying out carrier C from common carry-out port 79. In addition, carrier C is delivered among the processing apparatuses by an inter-exclusive apparatus carrier transportation member 81 of substrate processing system 1. Accordingly, as compared with the case in which top transportation apparatus 12 carries in and out wafer W for each processing apparatus, a load of top transportation apparatus 12 decreases, and carrier C can be transported among the processing apparatuses regardless of the operational status of top transportation apparatus 12, and as a result, a throughput can be improved.

Figure 11:
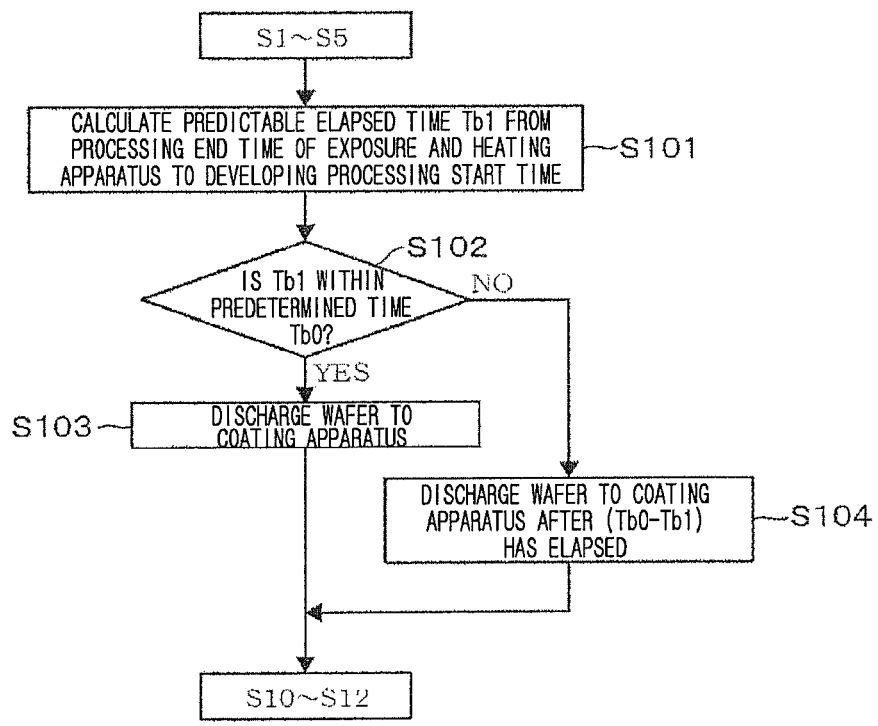
FIG. 11 is a flowchart showing a processing process of a substrate processing system.

Continually, a flow of a first modified example of the first exemplary embodiment is shown in FIG. 11. In this modified example, a predictable elapsed time up to the start of developing processing from the end of exposure and heating processing is controlled, instead of controlling the predictable elapsed time up to the start of exposure processing from the end of coating processing of resist. First, the processing is performed according to steps S1 to S5. In addition, cluster controller 21 calculates the processing end time of the exposure and heating apparatus, and the developing processing start time of carrier C of a predetermined wafer lot on the basis of the processing status, the maintenance information, and the adjustment time in each processing apparatus similarly as the first exemplary embodiment. Further, cluster controller 21 calculates a predictable elapsed time Tb1 up to the developing processing start time from the exposure and heating processing end time (step S101). Continually, cluster controller 21 determines whether calculated predictable elapsed time Tb1 is within a predetermined time Tb0 (step S102).

When it is determined that predictable elapsed time Tb1 is within predetermined time Tb0 in step S102, the processing of the wafer lot begins in selected coating apparatus 4 at the time when carrier C can be processed (step S103). When it is determined that predictable elapsed time Tb1 is not within predetermined Tb0 in step S103, the processing of wafer lot E begins after the time equal to "Tb1−Tb0" has elapsed from the time when carrier C can be processed (step S104). Thereafter, the processing is performed according to steps S10 to S12 described above.

Figure 12:
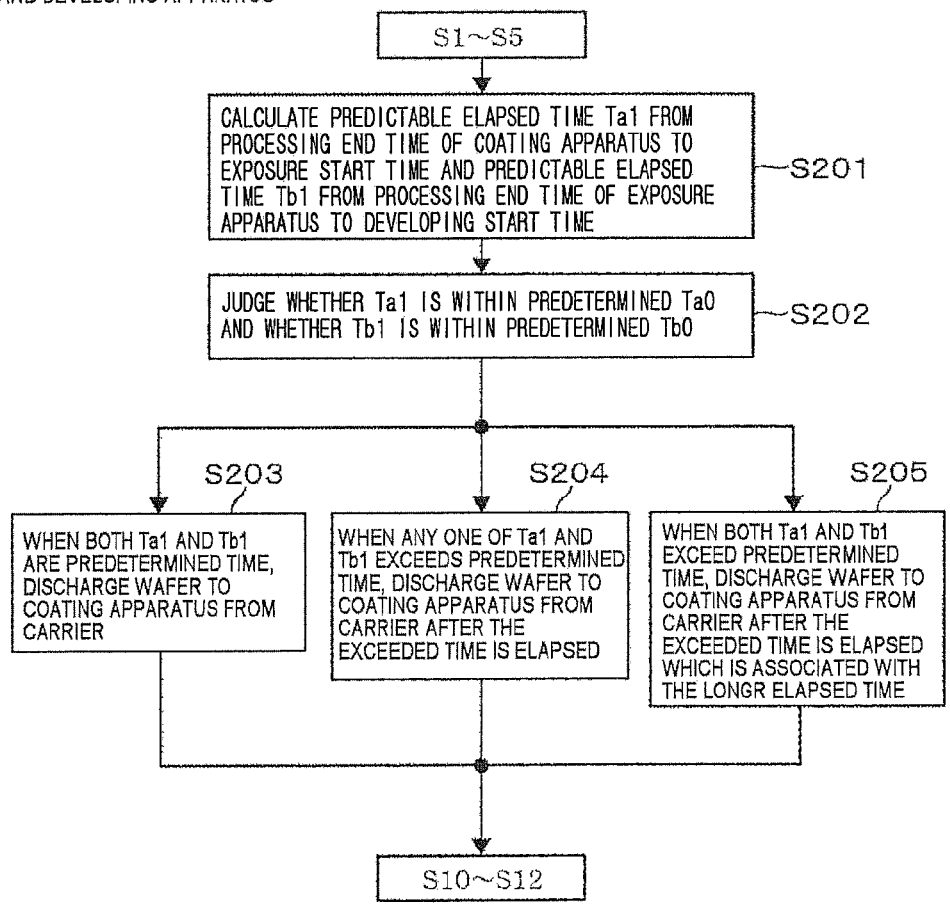
FIG. 12 is a flowchart showing a processing process of a substrate processing system.

A flow of a second modified example of the first exemplary embodiment is shown in FIG. 12. In the second modified example, the predictable elapsed time up to the start of exposure processing from the end of coating processing of resist and the predictable elapsed time up to the start of developing processing from the end of exposure and heating processing are both controlled. First, the processing is performed according to steps S1 to S5 described above and thereafter, cluster controller 21 calculates the predictable elapsed time Ta1 up to the exposure start time from the processing end time of the coating apparatus in a carrier C of a predetermined wafer lot on the basis of the processing status, the maintenance information, and the adjustment time in each processing apparatus similarly as in step S6 of the first exemplary embodiment. Further, cluster controller 21 calculates the predictable elapsed time Tb1 up to the developing processing start time from the exposure and heating processing end time similarly as in step S101 of the first modified example (step S201).

Continually, cluster controller 21 determines whether calculated predictable elapsed time Ta1 is within predetermined time Ta0. Further, it is determined whether predictable elapsed time Tb1 is within predetermined time Tb0 (step S202).

When it is determined that predictable elapsed time Ta1 is within predetermined time Ta0 and predictable elapsed time Tb1 is within predetermined time Tb0, the processing of the wafer lot begins at the time when the wafer lot can be processed in selected coating apparatus 4 (step S203).

When predictable elapsed time Ta1 exceeds predetermined time Ta0 or predictable elapsed time Tb1 exceeds predetermined time Tb0, cluster controller 21 calculates the exceeding time. In addition, when the calculated time elapsed from the time when the wafer lot can be processed in selected coating apparatus 4, the processing of the wafer lot begins (step S204).

When predictable elapsed time Ta1 exceeds predetermined time Ta0 and predictable elapsed time Tb1 exceeds predetermined time Tb0, cluster controller 21 calculates the exceeding times that exceeded predetermined time Ta0 and Tb0 for predictable elapsed times Ta1 and Tb1, respectively. In addition, when the exceeded time is elapsed which is associated with the longer elapsed time from the time when the wafer lot can be processed in selected coating apparatus 4, the processing of the wafer lot begins (step S205). Thereafter, the processing is performed according to steps S10 to S12 described above.

As described above, in substrate processing system 1, for example, a user can arbitrarily select whether or not controlling a time until processing of any process ends after processing of any process ends with respect to the wafer lot.

Second Exemplary Embodiment

Figure 13:
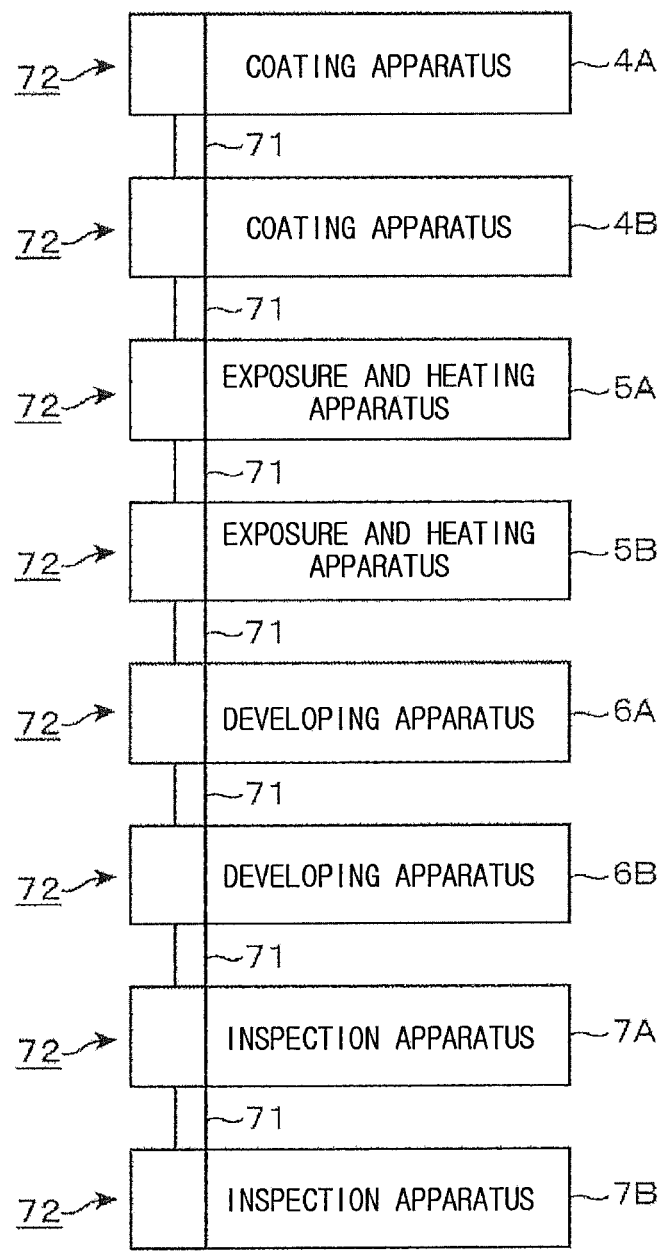
FIG. 13 is a configuration diagram showing a modified example of a substrate processing system.

FIG. 13 shows a layout of a substrate processing system 121 of a second exemplary embodiment. Coating apparatuses 4A and 4B, exposure and heating apparatuses 5A and 5B, developing apparatuses 6A and 6B, and inspection apparatuses 7A and 7B are sequentially connected in the order as described.

Inspection apparatuses 7A and 7B include inspection modules inspecting the surface state of wafer W after a developing process. Inspection apparatuses 7A and 7B are configured similarly to coating apparatus 4A except that the inspection module is loaded in processing station 101 instead of the coating module. Wafer W after the developing process is inspected by inspection apparatus 7A or 7B. Carrier C is transported toward inspection apparatus 7B from coating apparatus 4A, and common carry-out port 79 is provided in carrier station 72 of inspection apparatus 7B.

In substrate processing system 121, the maintenance information, the processing status of wafer W and the adjustment time determined based on the recipe are transmitted to cluster controller 21 from each apparatus, and cluster controller 21 determines the transportation destination of the lot based on the transmitted data, similarly to substrate processing system 1. In addition to coating apparatus 4, exposure and heating apparatus 5, and developing apparatus 6, any one inspection apparatus having the earlier processing start time will be determined as the transportation destination of the wafer lot between inspection apparatuses 7A and 7B. Thereafter, the discharge of the wafer lot to coating apparatus 4 is controlled similarly to the first exemplary embodiment.

In substrate processing system 121, a predictable elapsed time between a processing start time of the inspection apparatus and a processing end time of an upstream apparatus of the inspection apparatus is calculated, and wafer W can be controlled to be discharged to the coating apparatus according to the predictable elapsed time, similarly as each example of the first exemplary embodiment.

Instead of inspection apparatuses 7A and 7B, a plurality of cleaning apparatuses performing cleaning processing of wafer W after the developing processing may be provided. The cleaning apparatuses have similar configuration to inspection apparatuses 7A and 7B except for including, instead of the inspection modules, a cleaning module that supplies a cleaning solution to wafer W to clean wafer W. The cleaning apparatuses may be provided either on the front-stage or on the rear-stage of inspection modules 7A and 7B.

Figure 14:
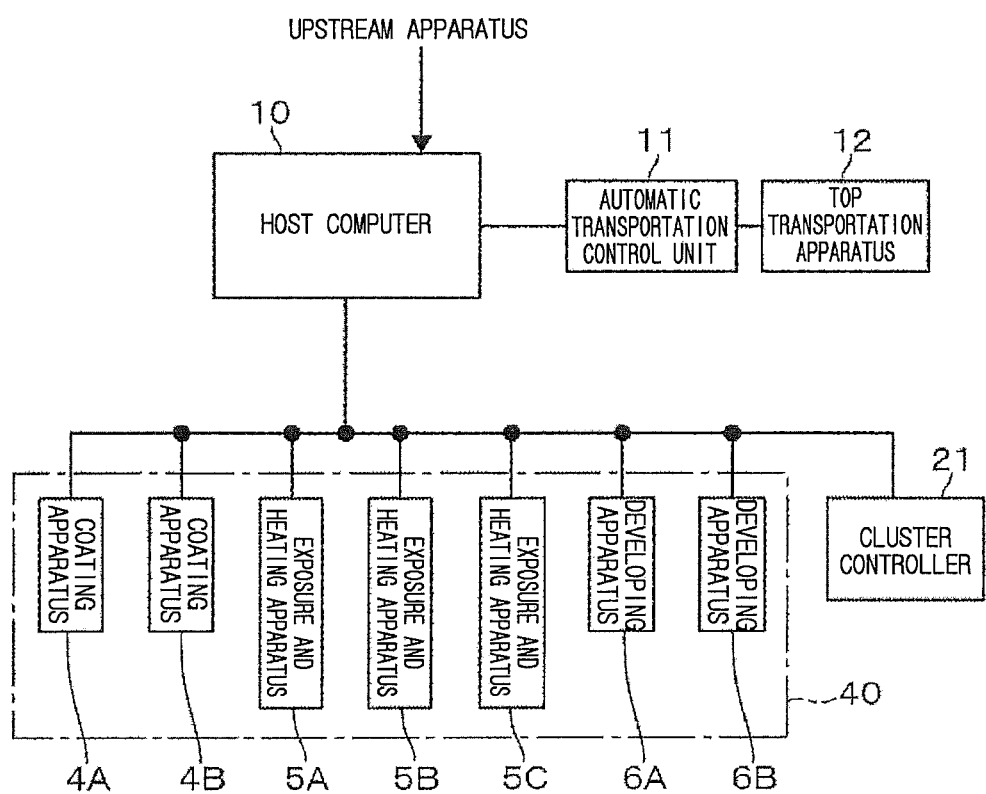
FIG. 14 is an overall configuration diagram of another substrate processing system.

Connection between cluster controller 21 and host computer 10 is not limited to the example of FIG. 1, but cluster controller 21 and host computer 10 may be connected as shown in FIG. 14. In this example, cluster controller 21 is connected to processing apparatus group 40 in parallel at a downstream side of host computer 10. Also, an ID of the wafer lot, a recipe of the wafer lot, and a processing parameter are transmitted from host computer 10 to cluster controller 21 and processing apparatus group 40. When cluster controller 21 is in trouble, the selection of processing apparatus group 40 and the discharge control of the wafer lot based on the predictable elapsed time cannot be performed. However, processing apparatus group 40 may be separately operate to transport and process wafer W between the processing apparatuses.

Although inter-apparatus carrier transportation member 81 is provided in each example described above, carrier C may be transported between the apparatuses by using top transportation apparatus 12 instead of providing the carrier transportation mechanism. For example, by providing a carry-out port in each processing apparatus instead of carrier transportation member 81, carrier C of which processing ends in the processing apparatus is transported to the carry-out port. In addition, top transportation apparatus 12 may receive carrier C from the carry-out port and load carrier C in carry-in port 77 of the selected processing apparatus in the rear-stage.

For example, in each exemplary embodiment, cluster controller 21 may determine the processing apparatus of the transportation destination of the wafer lot and control the discharge of wafer W from carrier C on the basis of the processing status of the wafer lot, and determine the adjustment time regardless of the maintenance time of each processing apparatus. Hereinafter, such example will be described. In this example, the time up to the processing start of exposure and heating apparatus 5 from the processing end in coating apparatus 4 may be controlled similarly as in the first exemplary embodiment.

When the processing times of wafer lots A to D and the adjustment times for processing each of wafer lots C to E are assumed to be set as shown in FIG. 9 of the first exemplary embodiment, the time when wafer lot E can be processed is earlier in coating apparatus 4A if the maintenance time is not considered, and as a result, cluster controller 21 determines transportation of the carrier of wafer lot E to coating apparatus 4A. In addition, according to steps S5 and S6, the carrier of wafer lot E is transported to coating apparatus 4A to calculate predictable elapsed time Ta1.

Figure 15:
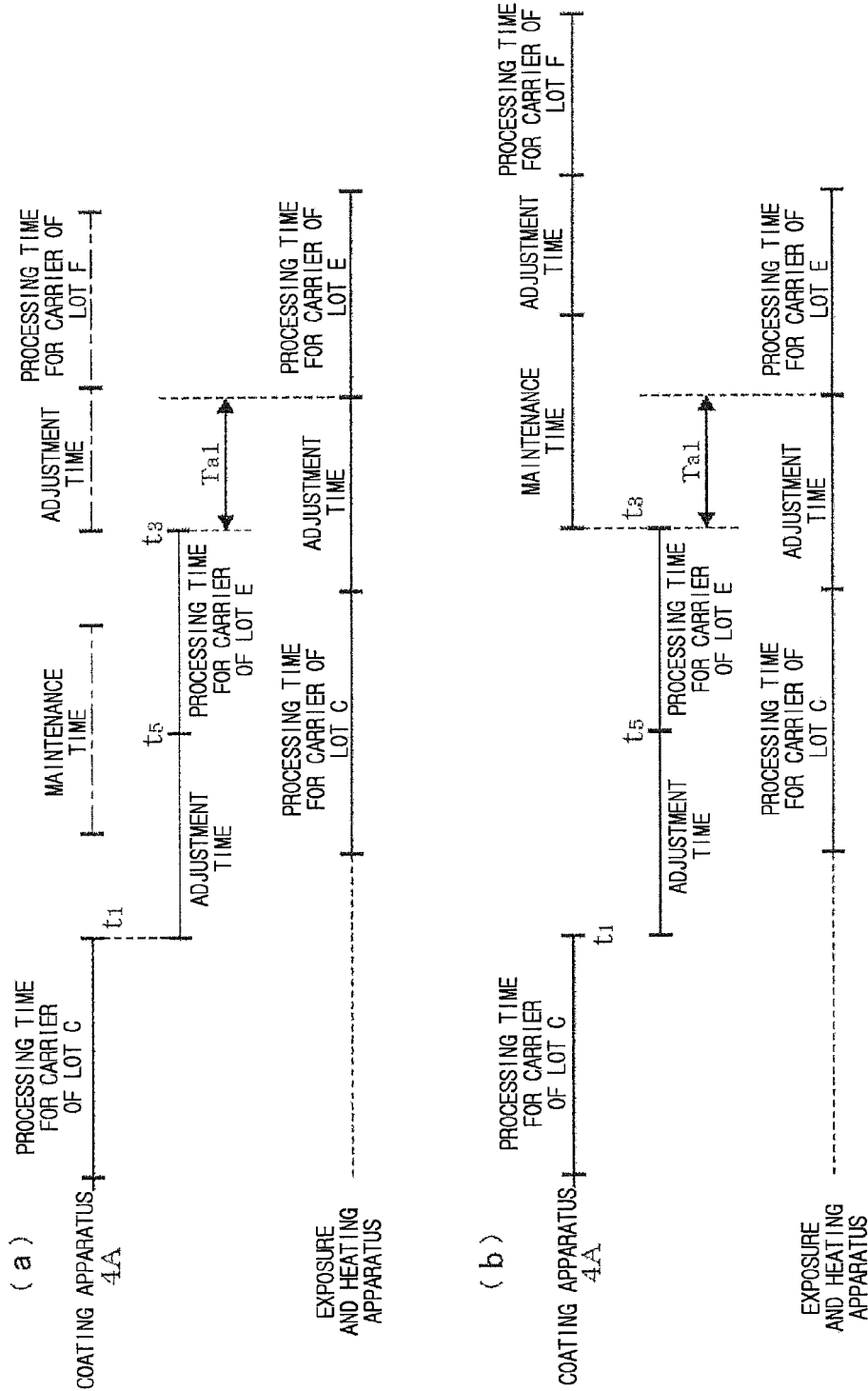
FIG. 15 is a time chart showing a processing status and a maintenance time of a wafer lot.

Herein, in each coating apparatus 4, e.g., when the maintenance time is overlapped with the adjustment time and processing time of the wafer lot, it is configured to set the maintenance start time to be different from the processing end time of the wafer lot. Specifically, wafer lot E will be described hereinafter. As shown in FIG. 15A, since the maintenance time of coating apparatus 4A is overlapped with the adjustment time and processing time of wafer lot E, coating apparatus 4A changes the setting of the maintenance time so that the maintenance begins from the time t3 when the processing of wafer lot E ends as shown in FIG. 15B. Wafer lot E is thereafter processed according to the steps after step S7.

Information regarding the change of a processing start time of a subsequent wafer lot (e.g., referred to as a wafer lot F in FIG. 15) carried into coating apparatus 4A, which is generated by the setting change is transmitted from coating apparatus 4A to cluster controller 21. Cluster controller 21 performs the processing by determining the transportation destination with respect to a subsequent wafer lot of which the transportation destination is not determined on the basis of the updated processing status of coating apparatus 4A, similarly to wafer lot E. Although this exemplary embodiment has similar effect to each exemplary embodiment described above, cluster controller 21 can surely control the discharge time of wafer W by selecting the processing apparatus and calculating predictable elapsed time Ta1 by referring to the maintenance time as well, thereby suppressing wafer W from being unnecessarily processed.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing system performing a processing operation by taking out a substrate from a carrier that stores the substrate on each wafer lot, the system comprising:
    (1) a processing apparatus group including a plurality of coating apparatuses each configured to form a resist film on the substrate, a plurality of exposure apparatuses each configured to expose the resist film on the substrate, and a plurality of developing apparatuses each configured to develop the substrate with a developer after an exposure process,
    (2) each of the coating apparatuses, each of the exposure apparatuses, and each of the developing apparatuses in the processing apparatus group includes a carry-in and carry-out stage through which a carrier that stores the substrate on each wafer lot is carried in and out, a carrier standby unit configured to allow the carrier to stand by, a carrier moving and loading unit configured to move and load the carrier between the carry-in and carry-out stage and the carrier standby unit, a delivery mechanism configured to deliver the substrate to the carrier loaded on the carry-in and carry-out stage, and a processing unit configured to perform a target process for the substrate delivered by the delivery mechanism, (3) a common carry-in port with respect to the processing apparatus group configured to receive the carrier that stores the substrate on each wafer lot from an automatic transportation apparatus and a common carry-out port with respect to the processing apparatus group configured to deliver the carrier to the automatic transportation apparatus, (4) an exclusive transportation mechanism configured to transport the carrier that stores the substrate on each wafer lot between the processing apparatuses adjacent to each other, (5) a group controller configured to manage the processing apparatus group, and control the carrier moving and loading unit and the exclusive transportation mechanism, and (6) a host computer configured to transmit a processing recipe for the substrate stored in the carrier transported by the automatic transportation apparatus to the carry-in and carry-out stage of a predetermined processing apparatus to the group controller, wherein the processing recipe includes parameters for the substrate stored in the carrier at one of a coating apparatus, an exposure apparatus, and a developing apparatus within the processing apparatus group, (7) wherein the group controller is programmed to:

(7-1) analyze the processing recipe of the substrate and a processing status sent from each coating apparatus, exposure apparatus, and developing apparatus within the processing group, and determine a combination of processing apparatuses in the processing apparatus group having a shortest total processing time for the substrate stored in the carrier when the carrier storing the substrate is carried into the common carry-in port of the processing apparatus group, the determined combination of processing apparatuses including at least one coating apparatus, one exposure apparatus, and one developing apparatus each selected among same type of processing apparatuses to have an earliest starting time among the same type of processing apparatuses, (7-2) calculate a predictable stand-by time for the substrate stored in the carrier located in the carry-in and carry-out stage of one of processing apparatuses in the determined combination from a processing end time for the substrate by the one of processing apparatuses in the determined combination up to a processing start time for the substrate by a processing apparatus next to the one of processing apparatuses in the determined combination on the basis of the processing recipe of the substrate and the processing status sent from each processing apparatus of the determined combination of processing apparatuses, and determine a timing of discharging the substrate from the carrier located in the carry-in and carry-out stage of the one of processing apparatuses in the determined combination to the one of processing apparatuses in the determined combination such that the predictable stand-by time is set within a predetermined time if the predictable stand-by time exceeds the predetermined time, and (7-3) carries out the carrier that stores the substrate in which a series of processing operations is completed by the plurality of processing apparatuses to the carry-out port.

2. The substrate processing system of claim 1, wherein the combination of the processing apparatuses and the predictable stand-by time are additionally determined based on maintenance information in each processing apparatus.

3. The substrate processing system of claim 1, wherein the processing apparatus group includes a plurality of inspection apparatuses configured to inspect the substrate developed by the developing apparatus, and each of the inspection apparatuses include a carry-in and carry-out stage through which a carrier is carried in and out, a carrier standby unit configured to allow the carrier to stand by, a carrier moving and loading unit configure to move and load the carrier between the carry-in and carry-out stage and the carrier standby unit, a delivery mechanism configured to deliver the substrate to the carrier loaded on the carry-in and carry-out stage, and an inspection unit configured to inspect the substrate delivered by the delivery mechanism.

4. The substrate processing system of claim 1, wherein the processing apparatus group includes a plurality of cleaning apparatuses configured to clean the substrate developed by the developing apparatus, each of the cleaning apparatuses includes carry-in and carry-out stage through which a carrier is carried in and out, a carrier standby unit configured to allow the carrier to stand by, a carrier moving and loading unit configured to move and load the carrier between the carry-in and carry-out stage and the carrier standby unit, a delivery mechanism configured to deliver the substrate to the carrier loaded on the carry-in and carry-out stage, and a cleaning unit configured to clean the substrate delivered by the delivery mechanism.

5. A substrate processing system performing a processing operation by taking out a substrate from a carrier that stores the substrate on each wafer lot, the system comprising:

(1) a processing apparatus group including a plurality of coating apparatuses each configured to form a resist film on the substrate, a plurality of exposure apparatuses each configured to expose the resist film on the substrate, and a plurality of developing apparatuses each configured to develop the substrate with a developer after an exposure process, (2) each of the coating apparatuses, each of the exposure apparatuses, and each of the developing apparatuses in the processing apparatus group includes a carry-in and carry-out stage through which a carrier that stores the substrate on each wafer lot is carried in and out, a carrier standby unit configured to allow the carrier to stand by, a carrier moving and loading unit configured to move and load the carrier between the carry-in and carry-out stage and the carrier standby unit, a delivery mechanism configured to deliver the substrate to the carrier loaded on the carry-in and carry-out stage, and a processing unit configured to perform a target process for the substrate delivered by the delivery mechanism, (3) a group controller configured to manage the processing apparatus group, and control the carrier moving and loading unit, and (4) a host computer configured to transmit a processing recipe for the substrate stored in the carrier transported by an automatic transportation apparatus to the carry-in and carry-out she of a predetermined processing apparatus to the group controller, wherein the processing recipe includes parameters for the substrate stored in the carrier at one of a coating apparatus, an exposure apparatus, and a developing apparatus within the processing apparatus group, (5) wherein the group controller is programmed to:
(5-1) analyze the processing recipe of the substrate and a processing status sent from each coating apparatus, exposure apparatus, and developing apparatus within the processing group, and determine a combination of processing apparatuses in the processing apparatus group having a shortest total processing time for the substrate stored in the carrier when the carrier storing the substrate is carried into a common carry-in port of the processing apparatus group, the determined combination of apparatuses including at least one coating apparatus, one exposure apparatus, and one developing apparatus each selected among same type of processing apparatuses to have an earliest starting time among the same type of processing apparatuses,
(5-2) carry the carrier into the carrier standby unit of a first processing apparatus of the determined combination of the processing apparatuses by the automatic transportation apparatus,
(5-3) transport the carrier from the carrier standby unit of the first processing apparatus to the carrier standby unit of a second processing apparatus in the determined combination of the processing apparatuses sequentially by the automatic transportation apparatus,
(5-4) calculate a predictable stand-by time for the substrate stored in the carrier located in the carry-in and carry-out stage of one of processing apparatuses in the determined combination from a processing end time for the substrate by the one of processing apparatuses in the determined combination up to a processing start time for the substrate by a processing apparatus next to the one of processing apparatuses in the determined combination on the basis of the processing recipe of the substrate and the processing status sent from each processing apparatus of the determined combination of processing apparatuses, and determine a timing of discharging the substrate from the carrier located in the carry-in and carry-out stage of the one of processing apparatuses in the determined combination to the one of processing apparatuses in the determined combination such that the predictable stand-by time is set within a predetermined time if the predictable stand-by time exceeds the predetermined time, and
(5-5) carries out the carrier that receives the substrate in which a series processing operations is completed by the automatic transportation apparatus from the carrier standby unit of the processing apparatus that performs a final processing.

6. A substrate processing method performed with a substrate processing apparatus including,
a processing apparatus group including a plurality of coating apparatuses each configured to form a resist film on the substrate, a plurality of exposure apparatuses each configured to expose the resist film on the substrate, and a plurality of developing apparatuses each configured to develop the substrate with a developer after an exposure process,
each of the coating apparatuses, each of the exposure apparatuses, and each of the developing apparatuses in the processing apparatus group includes a carry-in and carry-out stage through which a carrier that stores the substrate on each wafer lot is carried in and out, a carrier standby unit configured to allow the carrier to stand by, a carrier moving and loading unit configured to move and load the carrier between the carry-in and carry-out stage and the carrier standby unit, a delivery mechanism configured to deliver the substrate to the carrier loaded on the carry-in and carry-out stage, and a processing unit configured to perform a target process for the substrate delivered by the delivery mechanism,
the method comprising:
analyzing, by a group controller, a processing recipe for the substrate and a processing status sent from each coating apparatus, exposure apparatus, and developing apparatus within the processing group, and determining, by the group controller, a combination of processing apparatuses in the processing apparatus group having a shortest total processing time for the substrate stored in the carrier when the carrier storing the substrate is carried into a common carry-in port of the processing apparatus group, the determined combination of processing apparatuses including at least one coating apparatus, one exposure apparatus, and one developing apparatus each selected among same type of processing apparatuses to have an earliest starting time among the same type of processing apparatuses;
transmitting the processing recipe for the substrate in the carrier transported by the automatic transportation apparatus from a host computer to a group controller;
calculating a predictable stand-by time for the substrate stored in the carrier located in the carry-in and carry-out stage of one of processing apparatuses in the determined combination from a processing end time for the substrate by the one of processing apparatuses in the determined combination up to a processing start time for the substrate by a processing apparatus next to the one of processing apparatuses in the determined combination on the basis of the processing recipe of the substrate and the processing status sent from each processing apparatus of the determined combination of processing apparatuses;
determining a timing of discharging the substrate from the carrier located in the carry-in and carry-out stage of the one of processing apparatuses in the determined combination to the one of processing apparatuses in the determined combination such that the predictable stand-by time is set within a predetermined time if the predictable stand-by time exceeds the predetermined time;
transporting the carrier that stores the substrate completed with a series of processing operations by the one of processing apparatuses in the determined combination to a processing apparatus next to the one of processing apparatuses in the determined combination; and
carrying out the carrier that stores the substrate completed with a series of processing operations by all of the processing apparatuses in the determined combination to a common carry-out port of the processing apparatus group.

7. The substrate processing method of claim 6, wherein the combination of the processing apparatuses and the predictable stand-by time may be additionally determined based on maintenance information in each processing apparatus.

8. The substrate processing method of claim 6, wherein the processing apparatus group includes a plurality of inspection apparatuses configured to inspect the substrate developed by the developing apparatus, and
each of the inspection apparatuses may include a carry-in and carry-out stage through which a carrier is carried in and out, a carrier standby unit configured to allow the carrier to stand by, a carrier moving and loading unit configured to move and load the carrier between the carry-in and carry-out stage and the carrier standby unit, a delivery mechanism configured to deliver the substrate to the carrier loaded on the carry-in and carry-out stage, and an inspection unit configured to inspect the substrate delivered by the delivery mechanism.

9. The substrate processing system of claim 6, wherein the processing apparatus group includes a plurality of cleaning apparatuses configured to clean the substrate developed by the developing apparatus, each of the cleaning apparatuses includes a carry-in and carry-out stage through which a carrier is carried in and out, a carrier standby unit configured to allow the carrier to stand by, a carrier moving and loading unit configured to move and load the carrier between the carry-in and carry-out stage and the carrier standby unit, a delivery mechanism configured to deliver the substrate to the carrier loaded on the carry-in and carry-out stage, and a cleaning unit configured to clean the substrate delivered by the delivery mechanism.

10. A substrate processing method performed with a substrate processing apparatus including, a processing apparatus group including a plurality of coating apparatuses each configured to form a resist film on the substrate, a plurality of exposure apparatuses each configured to expose the resist film on the substrate, and a plurality of developing apparatuses configured to develop the substrate with a developer after an exposure process, each of the coating apparatuses, each of the exposure apparatuses, and each of the developing apparatuses in the processing apparatus group includes a carry-in and carry-out stage through which a carrier that stores the substrate on each wafer lot is carried in and out, a carrier standby unit configured to allow the carrier to stand by, a carrier moving and loading unit configured to move and load the carrier between the carry-in and carry-out stage and the carrier standby unit, a delivery mechanism configured to deliver the substrate to the carrier loaded on the carry-in and carry-out stage, and a processing unit configured to perform a target process for the substrate delivered by the delivery mechanism, the method comprising:

transporting the carrier that stores the substrate on each wafer lot by an automatic transportation apparatus;

transmitting a processing recipe for the substrate in the carrier transported by the automatic transportation apparatus from a host computer to a group controller;

analyzing, by the group controller, a processing recipe for the substrate and a processing status sent from each coating apparatus, exposure apparatus, and developing apparatus within the processing group, and determining, by the group controller, a combination of processing apparatuses in the processing apparatus group having a shortest total processing time for the substrate stored in the carrier when the carrier storing the substrate is carried into a common carry-in port of the processing apparatus group, the determined combination of apparatuses including at least one coating apparatus, one exposure apparatus, and one developing apparatus each selected among same type of processing apparatuses to have an earliest starting time among the same type of processing apparatuses;

delivering the carrier to the carrier standby unit of a first processing apparatus in the determined combination of the processing apparatuses by the automatic transportation apparatus;

calculating a predictable stand-by time for the substrate stored in the carrier located in the carry-in carry-out stage of one of processing apparatuses in the determined combination from a processing end time for the substrate by the one of processing apparatuses in the determined combination up to a processing start time for the substrate by a processing apparatus next to the one of processing apparatuses in the determined combination on the basis of the processing recipe of the substrate and the processing status sent from each processing apparatus of the determined combination of processing apparatuses;

determining a timing of discharging the substrate from the carrier located in the carry-in and carry-out stage of the one of processing apparatuses in the determined combination to the one of processing apparatuses in the determined combination such that the predictable stand-by time is set within a predetermined time if the predictable stand-by time exceeds the predetermined time;

transporting the carrier that stores the substrate completed with a series of processing operations by the one of processing apparatuses in the determined combination to a processing apparatus next to the one of processing apparatuses in the determined combination; and carrying out the carrier that stores the substrate completed with a series of processing operations by all of the processing apparatus in the determined combination to a common carry-out port of the processing apparatus group.

11. The substrate processing method of claim 10, wherein the processing apparatus group includes a plurality of inspection apparatuses configured to inspect the substrate developed by the developing apparatus, and each of the inspection apparatuses may include a carry-in and carry-out stage through which a carrier is carried in and out, a carrier standby unit configured to allow the carrier to stand by, a carrier moving and loading unit configured to move and load the carrier between the carry-in and carry-out stage and the carrier standby unit, a delivery mechanism configured to deliver the substrate to the carrier loaded on the carry-in and carry-out stage, and an inspection unit configured to inspect the substrate delivered by the delivery mechanism.

12. The substrate processing method of claim 10, wherein the processing apparatus group includes a plurality of cleaning apparatuses configured to clean the substrate developed by the developing apparatus, each of the cleaning apparatuses includes a carry-in and carry-out stage through which a carrier is carried in and out, a carrier standby unit configured to allow the carrier to stand by, a carrier moving and loading unit configured to move and load the carrier between the carry-in and carry-out stage and the carrier standby unit, a delivery mechanism configured to deliver the substrate to the carrier loaded on the carry-in and carry-out stage, and a cleaning unit configured to clean the substrate delivered by the delivery mechanism.

* * * * *